(12) United States Patent
Englund et al.

(10) Patent No.: US 11,522,117 B2
(45) Date of Patent: Dec. 6, 2022

(54) PHONONIC BUS FOR COHERENT INTERFACES BETWEEN A SUPERCONDUCTING QUANTUM PROCESSOR, SPIN MEMORY, AND PHOTONIC QUANTUM NETWORKS

(71) Applicant: Massachusetts Institute of Technology, Cambridge, MA (US)

(72) Inventors: Dirk Robert Englund, Brookline, MA (US); Matthew Edwin Trusheim, Cambridge, MA (US); Matt Eichenfield, Albuquerque, NM (US); Tomas Neuman, Cambridge, MA (US); Prineha Narang, Somerville, MA (US)

(73) Assignees: Massachusetts Institute of Technology, Cambridge, MA (US); President and Fellows of Harvard College, Cambridge, MA (US); National Tech. & Eng. Solutions of Sandia, LLC, Albequerque, NM (US)

( * ) Notice: Subject to any disclaimer, the term of this patent is extended or adjusted under 35 U.S.C. 154(b) by 85 days.

(21) Appl. No.: 17/151,763

(22) Filed: Jan. 19, 2021

(65) Prior Publication Data
US 2021/0296558 A1    Sep. 23, 2021

Related U.S. Application Data

(60) Provisional application No. 62/991,153, filed on Mar. 18, 2020.

(51) Int. Cl.
*G06N 10/00* (2022.01)
*H01L 39/22* (2006.01)
(Continued)

(52) U.S. Cl.
CPC .......... *H01L 39/223* (2013.01); *G06N 10/00* (2019.01); *G06N 10/40* (2022.01); *H01L 27/18* (2013.01); *H01L 27/20* (2013.01)

(58) Field of Classification Search
CPC .............................. G06N 10/00; G06N 10/40
See application file for complete search history.

(56) References Cited

U.S. PATENT DOCUMENTS 9,928,827 B1 * 3/2018 El-Kady ................ G06N 10/00

OTHER PUBLICATIONS

Kurizik,"Quantum technologies with hybrid systems," Proceedings of the National Academy of Sciences vol. 112 | No. 13 Mar. 31, 2015 3866-3873 (Year: 2015).*

(Continued)

*Primary Examiner* — Matthew L Reames
(74) *Attorney, Agent, or Firm* — Smith Baluch LLP

(57) ABSTRACT

A hybrid quantum system performs high-fidelity quantum state transduction between a superconducting (SC) microwave qubit and the ground state spin system of a solid-state artificial atom. This transduction is mediated via an acoustic bus connected by piezoelectric transducers to the SC microwave qubit. For SC circuit qubits and diamond silicon vacancy centers in an optimized phononic cavity, the system can achieve quantum state transduction with fidelity exceeding 99% at a MHz-scale bandwidth. By combining the complementary strengths of SC circuit quantum computing and artificial atoms, the hybrid quantum system provides high-fidelity qubit gates with long-lived quantum memory, high-fidelity measurement, large qubit number, reconfigurable qubit connectivity, and high-fidelity state and gate teleportation through optical quantum networks.

20 Claims, 5 Drawing Sheets

(51) Int. Cl.
G06N 10/40 (2022.01)
H01L 27/18 (2006.01)
H01L 27/20 (2006.01)

(56) References Cited

OTHER PUBLICATIONS

Pirkkalainen et al. "Hybrid circuit cavity quantum electrodynamics with a micromechanical resonator," arXiv:1207.1637 (Year: 2013).*
Arrangoiz-Arriola et al., "Coupling a superconducting quantum circuit to a phononic crystal defect cavity." Physical Review X 8.3 (2018): 031007. 10 pages.
Arute et al., "Quantum supremacy using a programmable superconducting processor." Nature 574.7779 (2019): 505-510.
Awschalom et al., "Quantum technologies with optically interfaced solid-state spins." Nature Photonics 12.9 (2018): 516-527.
Barends et al., "Diabatic gates for frequency-tunable superconducting qubits." Physical Review Letters 123.21 (2019): 210501. 6 pages.
Becker et al., "All-optical control of the silicon-vacancy spin in diamond at millikelvin temperatures." Physical Review Letters 120.5 (2018): 053603. 6 pages.
Bernien et al., "Heralded entanglement between solid-state qubits separated by three metres." Nature 497.7447 (2013): 86-90.
Bersin et al., "Individual control and readout of qubits in a sub-diffraction volume." npj Quantum Information 5.1 (2019): 1-6.
Bhaskar et al., "Experimental demonstration of memory-enhanced quantum communication." arXiv preprint arXiv:1909.01323 (2019). 15 pages.
Bhaskar et al., "Experimental demonstration of memory-enhanced quantum communication." Nature 580.7801 (2020): 60-64.
Bienfait et al., "Phonon-mediated quantum state transfer and remote qubit entanglement." Science 364.6438 (2019): 368-371.
Blais et al., "Cavity quantum electrodynamics for superconducting electrical circuits: An architecture for quantum computation." Physical Review A 69.6 (2004): 062320. 14 pages.
Bochmann et al., "Nanomechanical coupling between microwave and optical photons." Nature Physics 9.11 (2013): 712-716.
Bradley et al., "A ten-qubit solid-state spin register with quantum memory up to one minute." Physical Review X 9.3 (2019): 031045. 29 pages.
Bradley et al., "A ten-qubit solid-state spin register with quantum memory up to one minute." Physical Review X 9.3 (2019): 031045. 12 pages.
Chan et al., "Laser cooling of a nanomechanical oscillator into its quantum ground state." Nature 478.7367 (2011): 89-92.
Chen et al., "Orbital state manipulation of a diamond nitrogen-vacancy center using a mechanical resonator." Physical Review Letters 120.16 (2018): 167401. 6 pages.
Chen et al., "Qubit architecture with high coherence and fast tunable coupling." Physical Review Letters 113.22 (2014): 220502. 5 pages.
Childress et al., "Coherent dynamics of coupled electron and nuclear spin qubits in diamond." Science 314.5797 (2006): 281-285.
Christle et al., "Isolated electron spins in silicon carbide with millisecond coherence times." Nature Materials 14.2 (2015): 160-163.
Chu et al., "Quantum acoustics with superconducting qubits." Science 358.6360 (2017): 199-202.
Cirac et al., "Quantum state transfer and entanglement distribution among distant nodes in a quantum network." Physical Review Letters 78.16 (1997): 3221. 4 pages.
De Lange et al., "Universal dynamical decoupling of a single solid-state spin from a spin bath." Science 330.6000 (2010): 60-63.
Devoret et al., "Superconducting qubits: A short review." arXiv preprint cond-mat/0411174 (2004). 41 pages.
Eichenfield et al., "Design, fabrication, and measurement of RF IDTs for efficient coupling to wavelength-scale structures in thin piezoelectric films." 2013 IEEE International Ultrasonics Symposium (IUS). IEEE, 2013. 4 pages.
Eichenfield et al., "Optomechanical crystals." Nature 462.7269 (2009): 78-82.
Evans et al., "Photon-mediated interactions between quantum emitters in a diamond nanocavity." Science 362.6415 (2018): 662-665.
Falk et al., "Electrically and mechanically tunable electron spins in silicon carbide color centers." Physical Review Letters 112.18 (2014): 187601. 6 pages.
Fang et al., "Optical transduction and routing of microwave phonons in cavity-optomechanical circuits." Nature Photonics 10.7 (2016): 489-496.
Farfurnik et al., "Optimizing a dynamical decoupling protocol for solid-state electronic spin ensembles in diamond." Physical Review B 92.6 (2015): 060301. 5 pages.
Gardiner, "Driving a quantum system with the output field from another driven quantum system." Physical Review Letters 70.15 (1993): 2269. 4 pages.
Geller et al., "Tunable coupler for superconducting Xmon qubits: Perturbative nonlinear model." Physical Review A 92.1 (2015): 012320. 9 pages.
Golter et al., "Optomechanical quantum control of a nitrogen-vacancy center in diamond." Physical Review Letters 116.14 (2016): 143602. 6 pages.
Habraken et al., "Continuous mode cooling and phonon routers for phononic quantum networks." New Journal of Physics 14.11 (2012): 115004. 31 pages.
Hann et al., "Hardware-efficient quantum random access memory with hybrid quantum acoustic systems." Physical Review Letters 123.25 (2019): 250501. 7 pages.
Hensen et al., "Experimental loophole-free violation of a Bell inequality using entangled electron spins separated by 1.3 km." arXiv preprint arXiv:1508.05949 (2015). 8 pages.
Higginbotham et al., "Harnessing electro-optic correlations in an efficient mechanical converter." Nature Physics 14.10 (2018): 1038-1042.
Humphreys et al., "Deterministic delivery of remote entanglement on a quantum network." Nature 558.7709 (2018): 268-273.
International Search Report and Written Opinion in International Patent Application No. PCT/US2021/013869 dated May 19, 2021, 11 pages.
Kjaergaard et al., "Superconducting qubits: Current state of play." Annual Review of Condensed Matter Physics 11 (2020): 369-395.
Kumar et al., "Interferometric output coupling of ring optical oscillators." Optics Letters 36.7 (2011): 1068-1070.
Kuzyk et al., "Scaling phononic quantum networks of solid-state spins with closed mechanical subsystems." Physical Review X 8.4 (2018): 041027. 14 pages.
Leibfried et al., "Toward Heisenberg-limited spectroscopy with multiparticle entangled states." Science 304.5676 (2004): 1476-1478.
Lemonde et al., "Phonon networks with silicon-vacancy centers in diamond waveguides." Physical Review Letters 120.21 (2018): 213603. 7 pages.
Li et al., "Honeycomblike phononic networks of spins with closed mechanical subsystems." Physical Review Applied 11.6 (2019): 064037. 10 pages.
Lu et al., "Universal stabilization of a parametrically coupled qubit." Physical Review Letters 119.15 (2017): 150502. 6 pages.
MacCabe et al., "Nano-acoustic resonator with ultralong phonon lifetime." Science 370.6518 (2020): 840-843.
MacCabe et al., "Phononic bandgap nano-acoustic cavity with ultralong phonon lifetime." arXiv preprint arXiv:1901.04129 (2019). 43 pages.
Maity et al., "Coherent acoustic control of a single silicon vacancy spin in diamond." Nature Communications 11.1 (2020): 1-6.
Maity et al., "Spectral alignment of single-photon emitters in diamond using strain gradient." Physical Review Applied 10.2 (2018): 024050. 7 pages.
Manenti et al., "Circuit quantum acoustodynamics with surface acoustic waves," Nat. Commun. 8 (2017): 975. 6 pages.
Meesala et al., "Strain engineering of the silicon-vacancy center in diamond." Physical Review B 97.20 (2018): 205444. 13 pages.

(56) References Cited

OTHER PUBLICATIONS

Milonni et al., "Exponential decay, recurrences, and quantum-mechanical spreading in a quasicontinuum model." Physical Review A 28.1 (1983): 32. 8 pages.
Mølmer et al., "Multiparticle entanglement of hot trapped ions." Physical Review Letters 82.9 (1999): 1835.
Mouradian et al., "Scalable integration of long-lived quantum memories into a photonic circuit." Physical Review X 5.3 (2015): 031009. 6 pages.
Mouradian et al., "Scalable integration of long-lived quantum memories into a photonic circuit." Physical Review X 5.3 (2015): 031009. 8 pages.
Narla et al., "Robust concurrent remote entanglement between two superconducting qubits." Physical Review X 6.3 (2016): 031036. 18 pages.
Neeley et al., "Generation of three-qubit entangled states using superconducting phase qubits." Nature 467.7315 (2010): 570-573.
Neuman et al., "Selective acoustic control of photon-mediated qubit-qubit interactions." arXiv preprint arXiv:1912.06160 (2019). 11 pages.
Nguyen et al., "An integrated nanophotonic quantum register based on silicon-vacancy spins in diamond." Physical Review B 100.16 (2019): 165428. 19 pages.
Nguyen et al., "Quantum network nodes based on diamond qubits with an efficient nanophotonic interface." Physical review letters 123.18 (2019): 183602. 6 pages.
Ofek et al., "Extending the lifetime of a quantum bit with error correction in superconducting circuits." Nature 536.7617 (2016): 441-445.
Pfaff et al., "Unconditional quantum teleportation between distant solid-state quantum bits." Science 345.6196 (2014): 532-535.
Pop et al., "Coherent suppression of electromagnetic dissipation due to superconducting quasiparticles." Nature 508.7496 (2014): 369-372.
Rozpędek et al., "Near-term quantum-repeater experiments with nitrogen-vacancy centers: Overcoming the limitations of direct transmission." Physical Review A 99.5 (2019): 052330. 29 pages.
Rueda et al., "Efficient microwave to optical photon conversion: an electro-optical realization." Optica 3.6 (2016): 597-604.
Safavi-Naeini et al., "Electromagnetically induced transparency and slow light with optomechanics." Nature 472.7341 (2011): 69-73.
Schütz et al., "Universal Quantum Transducers Based on Surface Acoustic Waves." Physical Review X 5.3 (2015). 30 pages.
Siddiqui et al., "Lamb wave focusing transducer for efficient coupling to wavelength-scale structures in thin piezoelectric films." Journal of Microelectromechanical Systems 27.6 (2018): 1054-1070.
Sletten et al., "Resolving phonon Fock states in a multimode cavity with a double-slit qubit." Physical Review X 9.2 (2019): 021056. 9 pages.
Sørensen et al., "Quantum computation with ions in thermal motion." Physical Review Letters 82.9 (1999): 1971. 4 pages.
Stannigel et al., "Optomechanical transducers for long-distance quantum communication." Physical Review Letters 105.22 (2010): 220501. 4 pages.
Stannigel et al., "Optomechanical transducers for quantum-information processing." Physical Review A 84.4 (2011): 042341. 23 pages.
Sukachev et al., "Silicon-vacancy spin qubit in diamond: a quantum memory exceeding 10 ms with single-shot state readout." Physical Review Letters 119.22 (2017): 223602. 6 pages.
Taminiau et al., "Universal control and error correction in multi-qubit spin registers in diamond." Nature Nanotechnology 9.3 (2014): 171. 7 pages.
Tanaka et al., "Dynamic control of the Q factor in a photonic crystal nanocavity." Nature Materials 6.11 (2007): 862-865.
Udvarhelyi et al., "Spin-strain interaction in nitrogen-vacancy centers in diamond." Physical Review B 98.7 (2018): 075201. 13 pages.
Understand, Predict, and Optimize Physics-Based Designs and Processes with COMSOL Multiphysics. COMSOL AB, Stockholm, Sweden. Accessed at https://www.comsol.com/comsol-multiphysics on May 30, 2021. 3 pages.
Waldherr et al., "Quantum error correction in a solid-state hybrid spin register." Nature 506.7487 (2014): 204-207.
Wan et al., "Large-scale integration of near-indistinguishable artificial atoms in hybrid photonic circuits." arXiv preprint arXiv:1911.05265 (2019). 11 pages.
Whiteley et al., "Spin-phonon interactions in silicon carbide addressed by Gaussian acoustics." Nature Physics 15.5 (2019): 490-495.
Wu et al., "Microwave-to-optical transduction using a mechanical supermode for coupling piezoelectric and optomechanical resonators." Physical Review Applied 13.1 (2020): 014027. 30 pages.
Zeuthen et al., "Electrooptomechanical equivalent circuits for quantum transduction." Physical Review Applied 10.4 (2018): 044036. 25 pages.

\* cited by examiner

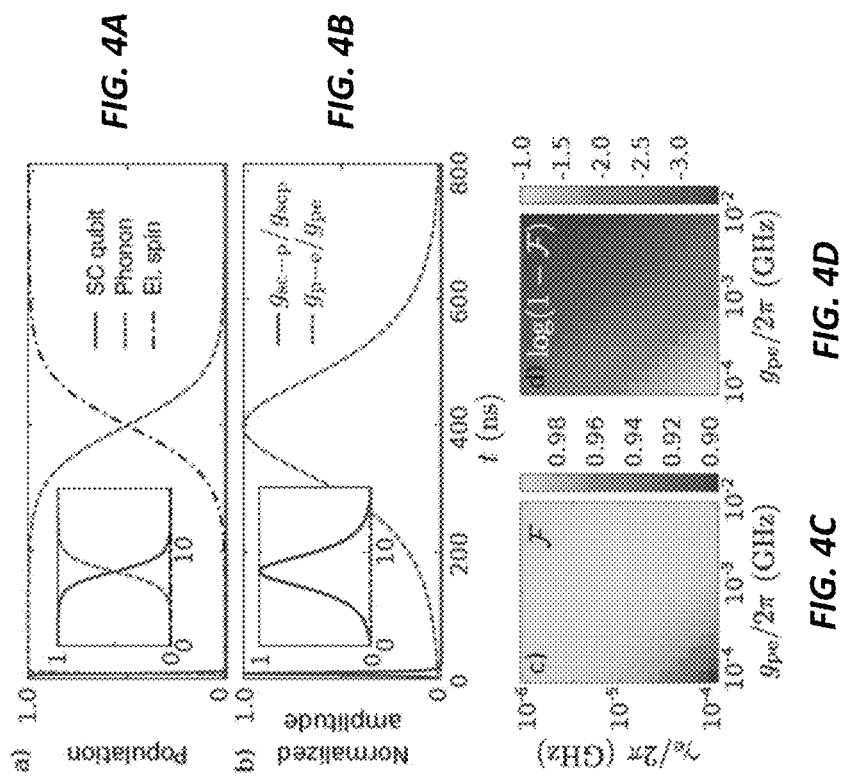
FIG. 4A
FIG. 4B
FIG. 4C
FIG. 4D
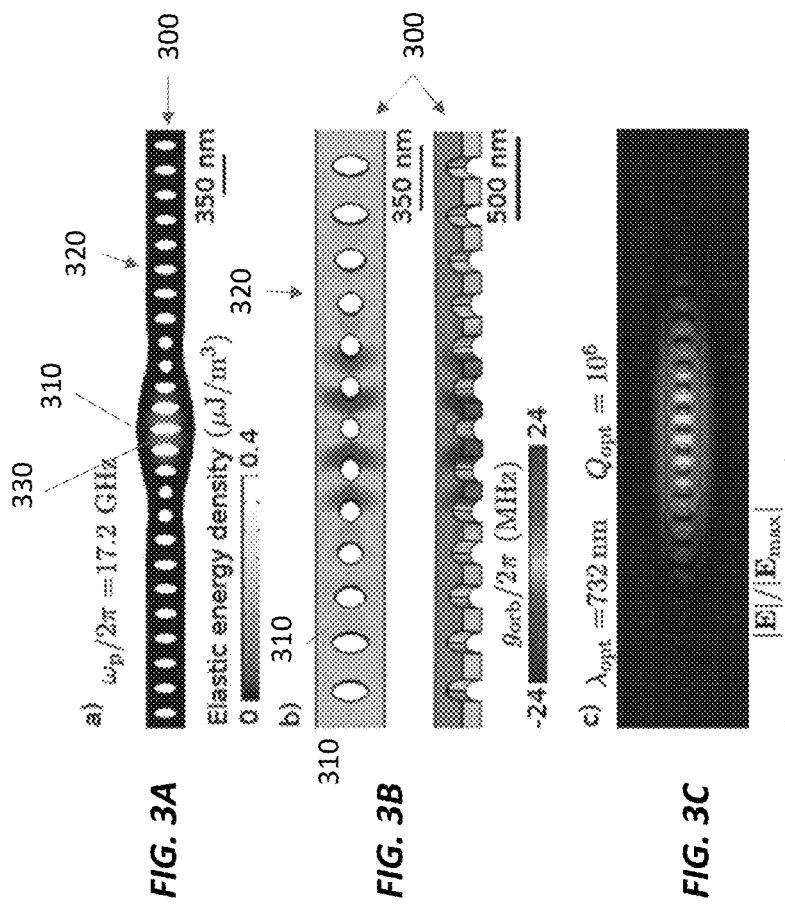
FIG. 3A
FIG. 3B
FIG. 3C

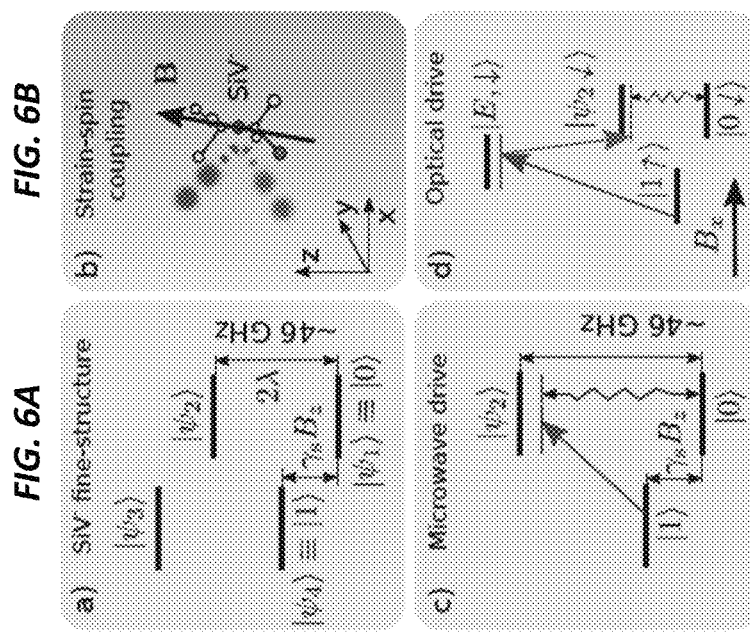
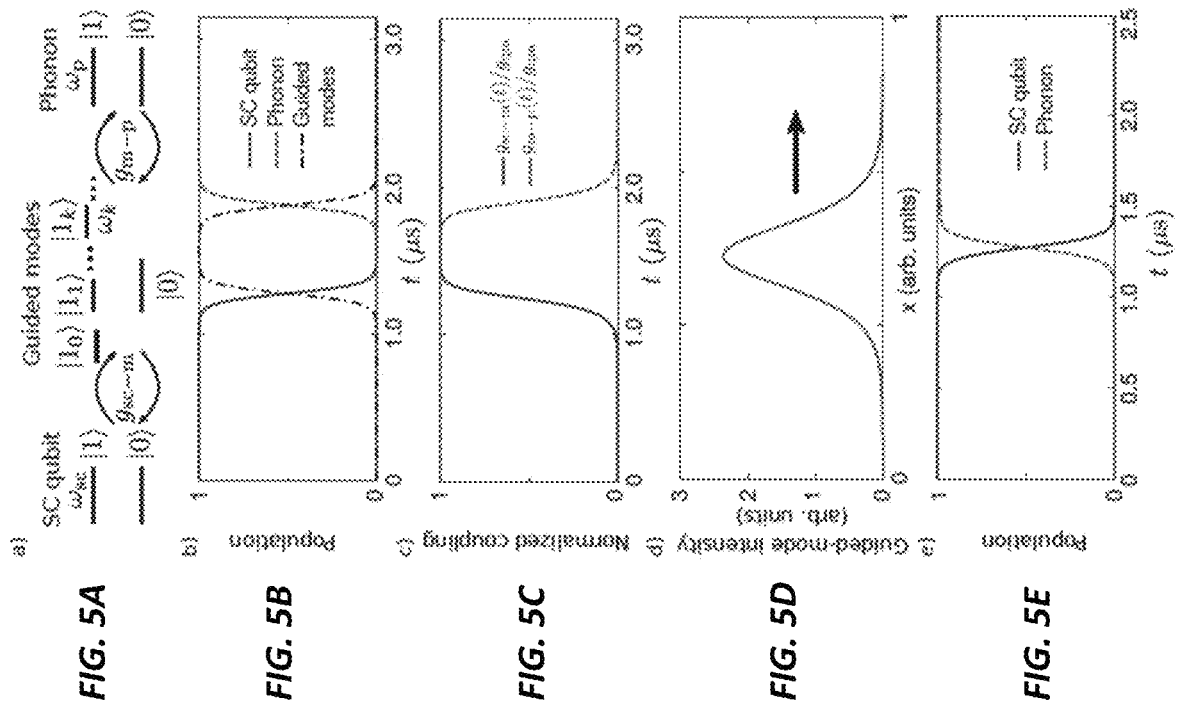

PHONONIC BUS FOR COHERENT INTERFACES BETWEEN A SUPERCONDUCTING QUANTUM PROCESSOR, SPIN MEMORY, AND PHOTONIC QUANTUM NETWORKS

CROSS-REFERENCE TO RELATED APPLICATION(S)

This application claims the priority benefit, under 35 U.S.C. 119(e), of U.S. Application No. 62/991,153, which was filed on Mar. 18, 2020, and is incorporated herein by reference in its entirety.

GOVERNMENT SUPPORT

This invention was made with Government support under Grant No. DE-SC0019140, DE-AC05-00OR22725, DE-NA003525 and FWP 19-022266 awarded by the Department of Energy. The Government has certain rights in the invention.

BACKGROUND

In quantum computing, a quantum bit or qubit is the basic unit of quantum information. The term qubit also refers to the physical quantum mechanical system that encodes the quantum information. Examples of physical-quantum-mechanical qubits include the spin of an electron, the spin of a nucleus, the polarization or time of arrival of a photon, and the charge, current, or energy of a Josephson junction, which is a pair of superconductors coupled by a weak link, such as a thin insulating barrier between the superconductors. These physical quantum mechanical systems have different advantages and disadvantages. For instance, Josephson junctions, also called superconducting (SC) qubits, have high fidelity and can be used in high-speed initialization and logic gates, but have short coherence times, poor long-range connectivity, low qubit number, and low readout fidelity. Artificial atoms have the advantages of long coherence times, coupling to optical fields for long-distance quantum information transfer, relatively straightforward production using nanofabrication, and high-fidelity control and readout. Unlike SC qubits, however, there is no high-speed local gate for two artificial atoms. Optical entangling gates are qualitatively advantageous but do not have the speed or fidelity of local gates for SC qubits. Other qubits might have longer coherence time, couple to different external quantities in different ways (magnetic or electric fields, temperature, optics), be measured or manipulated through different techniques, or be produced in a different fashion.

SUMMARY

A hybrid quantum system can combine the unique advantages of disparate physical qubits while satisfying challenges associated with each type of qubit by delegating different tasks to different types of qubits. One such hybrid quantum system is based on a mechanism for high-fidelity qubit transduction between a SC circuit (a first type of physical qubit implementation) and a solid-state artificial atom (AA; a second type of physical qubit implementation). Mediating this transduction is an acoustic bus, also called a phononic bus, that couples to the SC qubit and an AA electron spin via a combination of piezoelectric transduction and strong spin-strain coupling.

Applied to present-day experimental parameters for SC flux qubits and silicon vacancy (SiV$^-$) centers in diamond, this bus can achieve a quantum state transfer with fidelity exceeding 99% at a MHz-scale bandwidth. Hyperfine coupling to local $^{13}$C nuclear-spin qubits enables coherence times exceeding a minute, while excited orbital states enable long-distance state transfer across quantum networks by optically heralded entanglement. Moreover, the scheme is extensible to large numbers of spin qubits with deterministic addressability, potentially enabling integration of large-scale quantum memory. Noting that SiV$^-$ single-shot optical readout fidelity has been experimentally demonstrated to exceed 99.9%, this approach successfully addresses the challenges of SC qubit (i) coherence times, (ii) long-range connectivity, (iii) qubit number, and (iv) readout fidelity. By combining the complementary strengths of SC circuit quantum computing and artificial atoms, this hybrid SC-AA architecture has the elements for extensible quantum information processors: a high-fidelity quantum processing unit (QPU), a bus to scalable quantum memory, and a high-fidelity connection long-range optical quantum networks.

A hybrid quantum system can be implemented as an SC qubit (e.g., a Josephson junction), piezoelectric transducer, mechanical resonator/cavity (e.g., a diamond optomechanical cavity or silicon phononic cavity), and solid-state AA qubit (e.g., in a diamond layer on the silicon phononic cavity). In operation, the SC qubit emits a microwave photon representing a quantum state of the superconducting qubit. The piezoelectric transducer, which is coupled to the superconducting qubit, transduces the microwave photon into a phonon, which is absorbed by the mechanical resonator. And the AA qubit has an electron spin that is coupled to a strain induced in the mechanical resonator through absorption of the phonon and receives or encodes the quantum state.

The hybrid quantum system may also include a tunable coupler, phononic waveguide, and/or laser, microwave source, or magnetic field source. The tunable coupler controls a coupling strength between the superconducting qubit to the piezoelectric transducer. The phononic waveguide is coupled to the piezoelectric transducer and the mechanical resonator and guides the phonon between the piezoelectric transducer and the mechanical resonator. And the laser, microwave source, and/or magnetic field source mediate coupling between the electron spin and the strain. The laser and/or microwave source can also mediate coupling of the electron spin to a nuclear spin or a photon.

Emitting the microwave photon from the superconducting qubit may comprise smoothly varying a coupling strength between the superconducting qubit and a piezoelectric transducer. Similarly, coupling the strain in the mechanical resonator to the electron spin may comprise smoothly varying a coupling strength between the strain and the electron spin.

A hybrid quantum system can also include an SC quantum processing unit (QPU), an AA-based quantum memory, and a phononic bus. In operation, the phononic bus transfers a quantum state between the SC QPU and the AA-based quantum memory, which may encode the quantum state in an electron spin of an AA. Such a system may also include a piezoelectric transducer, operably coupled to the SC QPU and the phononic bus, to transduce a microwave photon representing the quantum state into a phonon and to couple the phonon to a mechanical mode of the phononic bus. The phononic bus may define a cavity that transduces the phonon into strain that is coupled to the AA-based quantum memory via strain-spin coupling whose strength can be controlled by a laser, microwave source, or electromagnet. The laser and/or microwave source can also be used to couple the AA-based quantum memory to a quantum network.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Other systems, processes, and features will become apparent to those skilled in the art upon examination of the following drawings and detailed description. It is intended that all such additional systems, processes, and features be included within this description, be within the scope of the present invention, and be protected by the accompanying claims.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3A shows the simulated distribution of elastic energy density of a mode of a diamond optomechanical cavity.

FIG. 3B shows a plan view (top) and a cross-sectional view (bottom) of the calculated coupling rate $g_{orb}$ in the phononic cavity.

FIG. 3C is a plot of the normalized amplitude of the optical electric field at vacuum wavelength $\lambda_{opt}$=732 nm of an optical mode of the diamond cavity of an optical quality factor $Q_{opt}$=10$^6$. The electric field is concentrated around the center of the cavity and thus overlaps with the regions providing high coupling rates $g_{orb}$.

FIG. 4A is a plot of the time-dependent populations of the SC qubit (solid line), the cavity phonon (dashed line), and the electron spin qubit (dash-dotted line) as a function of time during state transfer from the SC qubit to the electron spin, beginning in the excited state of the SC qubit.

FIG. 4B is a plot of the pulses applied to the tunable couplers between the SC qubit and piezoelectric transducer and between the mechanical resonator and electron spin during state transfer from the SC qubit to the electron spin as a function of time.

FIG. 4C is a plot of the calculated state-transfer fidelity $\mathcal{F}$ as a function of the phonon-electron-spin coupling $g_{pe}$ and the electron-spin dephasing rate $\gamma_e$.

FIG. 4D is a plot of the state-transfer infidelity $\log(1-\mathcal{F})$ as a function of the phonon-electron-spin coupling $g_{pe}$ and the electron-spin dephasing rate $\gamma_e$.

FIG. 5A illustrates a pitch-and-catch scheme for state transfer between the SC qubit and the phononic cavity.

FIG. 5B is a plot of the populations of the SC qubit (solid line), the phonon (dashed line), and the propagating photon (dash-dotted line) as a function of time for the pitch-and-catch scheme.

FIG. 5C is a plot of the time-dependent coupling rates $g_{sc-m}$ and $g_{m-p}$ applied to control the state transfer.

FIG. 5D illustrates a symmetrical photon wave packet (photon intensity shown as a function of distance along the waveguide) released by the SC qubit and propagating towards the receiving phononic cavity (shown by the arrow).

FIG. 5E shows the populations of the SC qubit (solid line) and the phonon (dashed line) as a function of time for the pitch-and-catch scheme using the master-equation approach.

FIG. 6A illustrates coupling between fine-structure states of a SiV$^-$ defect and strain.

FIG. 6B illustrates how an external magnetic field B and optical drive are applied to the SiV$^-$ defect to enable the strain-spin coupling.

FIG. 6C illustrates a microwave-based Raman scheme in which the upper and intermediate energy levels can couple via magnetic field and the lower and upper energy levels are coupled via strain.

FIG. 6D shows an optical Raman scheme exploiting a virtual excitation via an optically active excited state to induce an effective strain-mediated coupling between lower and intermediate energy levels.

DETAILED DESCRIPTION

A hybrid quantum system with a phononic bus can transduce quantum states between superconducting (SC) microwave and artificial atom (AA) spin qubits at fidelities approaching 1 and rates far exceeding intrinsic system decay and decoherence. A piezoelectric transducer or couples a microwave photon from the SC microwave qubit into a phonon that propagates via the phononic bus to a high-quality mechanical cavity that hosts the AA spin qubit. The hybrid quantum system uses strong coupling of a single defect center spin (the spin qubit) to the high-quality mechanical cavity to transfer quantum state represented by the phonon to the AA spin qubit. The AA spin qubit can be coupled to nuclear spins or to photons with external microwave or optical drives. This hybrid quantum system combines the favorable attributes of AA quantum memories with SC quantum information processors, enabling a wide range of functionalities not possible with stand-alone SC or spin-based architectures.

Figures 1A, 1B:
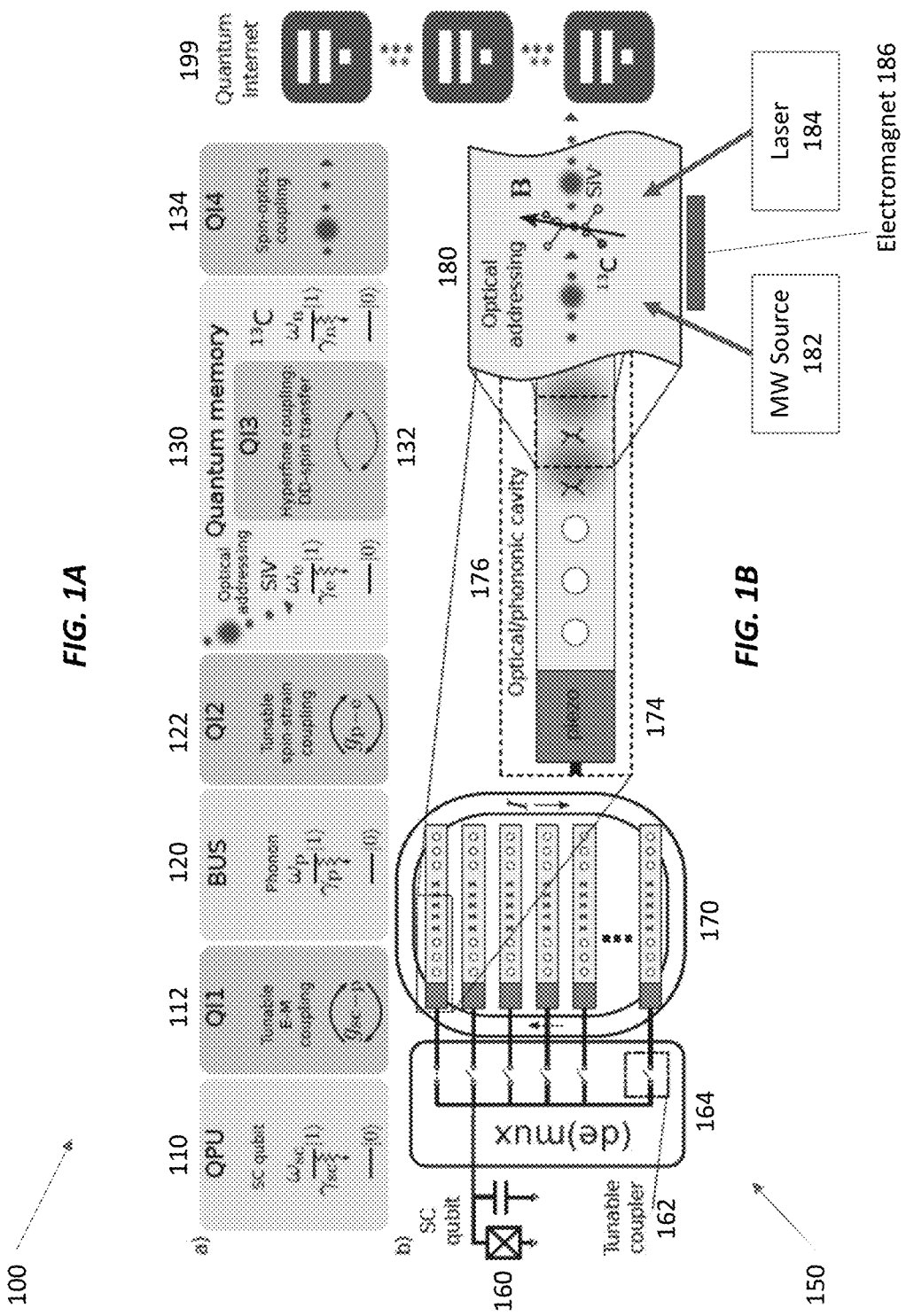
FIG. 1A is a block diagram of a hybrid quantum system with a phononic bus and quantum interfaces connecting a superconducting (SC) qubit quantum processing unit (QPU) to an artificial atom (AA) quantum memory.
FIG. 1B illustrates one possible physical implementation of the hybrid quantum system of FIG. 1A.

FIG. 1A is a block diagram of a hybrid quantum system 100 that combines four quantum interfaces between a superconducting (SC) quantum processing unit (QPU) 110 and an artificial atom (AA) quantum memory (QM) 130. A first quantum interface (QI1) 112 converts a microwave photon from the SC QPU 110 to a phonon that is coupled to a phononic bus 120, also called an acoustic bus. The phononic bus 120 couples the phonon to a second quantum interface (QI2) 122, which couples the phonon to electronic spin-orbit states of an AA (e.g., a silicon vacancy (SiV⁻) in diamond) whose electronic fine-structure/spin-orbit states serve as qubits. A third quantum interface (QI3) 132 couples the AA's fine-structure/spin-orbit states to nuclear spins (e.g., of a nearby $^{13}C$ nucleus) via the hyperfine interaction, providing ancillae qubits with long coherence times. The AA's fine-structure/spin-orbit states can also couple to optical photons in a fourth quantum interface (QI4) 132, serving as a quantum network port that can couple to the quantum internet 199. The optical response of AAs conditioned on the electron spin state can be used to generate heralded entanglement and thus allow for networking to other quantum devices on the quantum internet 199 via quantum-state teleportation.

The AA optical transitions provide an optical interface to quantum networks 199, for example, by multiple attempts of photon-based electron spin entanglement to provide an on-demand entanglement resource. Underlying these capabilities is a transduction scheme that exploits tunable electro-mechanical (E-M) coupling between the SC qubit in the QPU 110 and the mechanical mode of the phononic bus 120, tunable spin-strain coupling between the mechanical mode and the AA's electron spin, optical addressing of the AA's electron spin, and hyperfine coupling to connect the electron spin to the nuclear spin states in the QM 130.

As compared to optomechanical and electro-optical transduction schemes, quantum teleportation circumvents the direct conversion of quantum states into photons and thus reduces or minimizes the infidelity associated with undetected (unheralded) photon loss. Recent experiments have demonstrated the strain-mediated driving of an AA electron spin ground state with a classical phonon field. Quantum state transduction with near-unity fidelity should be possible using the strain-spin coupling rates measured in those experiments to inform a theoretical model and introducing a phononic cavity that achieves the strong coupling regime between a single phonon and an AA spin.

FIG. 1B shows a physical realization 150 of the hybrid quantum system 100 shown in FIG. 1A. In this physical realization 150, a Josephson junction or other SC qubit 160 is connected via a microwave multiplexer (mux) 164 and an array of tunable couplers 162, each of which can be implemented as microwave switch. Each tunable coupler 162 is connected to a corresponding piezoelectric transducer 174 and serves as a gate, which, when opened, allows energy to flow from the SC qubit 160 to the piezo transducer 174. In operation, the microwave mux 164 directs microwave photons from the SC qubit 160 to the piezoelectric transducers 174, which act as quantum interfaces that transduce or convert microwave photons from the SC qubit 160 into phonons. The tunable couplers 162 control the coupling between the SC qubit 160 and the piezoelectric transducers 174, e.g., to ensure that the phonon wave packet emitted by the piezoelectric transducer 174 is smoothly varying and symmetrical. The "pitch-and-catch" coupling scheme, discussed below, is one scheme for generating phonon wave packets with smooth dynamics.

Each piezoelectric transducer 162 is connected to a phononic bus 170 and couples the phonons generated from the microwave photons into a mechanical mode of a mechanical resonator or optical/phononic cavity 176 in the phononic bus 170. In this case, there is one-to-one matching of piezoelectric couplers 162 to the cavities 176. Each phononic/optical cavity 176 hosts one or more AAs 180, such as silicon or nitrogen vacancies in a diamond layer on the cavity 176, with spin-orbit states that act as qubits in a quantum memory. The AAs 180 may be subject to a bias magnetic field B applied by an electromagnet 186 or permanent magnet (not shown). The cavity 176 absorb the phonons from the piezoelectric transducers 174, generating a local strain that is strongly coupled to the spins of the AAs 180, effecting the quantum state transfer to the AAs 180. The quantum state transfer is reversible, meaning that a quantum state can also be transferred from the AAs 180 to the SC qubit 160 by operating the hybrid quantum system 150 in reverse.

Figures 2A, 2B, 2C, 2D, 2E, 2F:
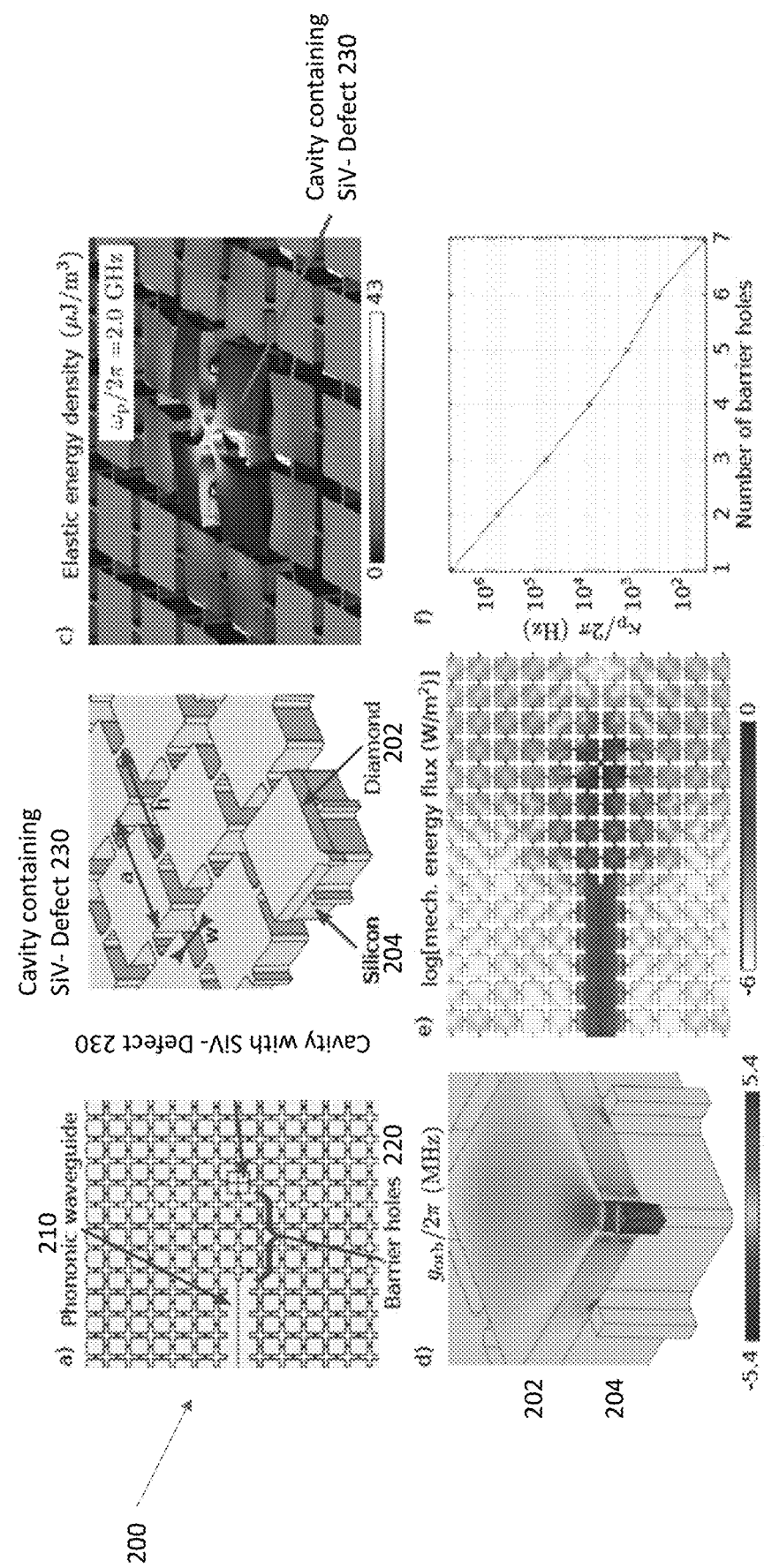
FIG. 2A illustrates a phononic cavity with a mechanical resonator embedded in a phononic crystal that is separated from a phononic waveguide by a number of barrier holes. The phononic crystal is formed of a silicon layer capped by a thin diamond layer.
FIG. 2B is a close-up of one quarter of the silicon-diamond structure in FIG. 2A. The dimensions are a=800 nm, h=0.94a, and w=0.2a. The silicon (diamond) layer thickness is $t_{Si}$=250 nm ($t_D$=100 nm). The width of the thin rectangular diamond interconnects is $w_D$=70 nm.
FIG. 2C shows the elastic energy density of the cavity mode is concentrated in the thin constriction of the diamond layer. The geometry of the cavity is artificially distorted along the coordinate of the mechanical mode.
FIG. 2D illustrates the coupling rate between the mechanical mode and the electron spin calculated as $g_{orb}$/2.
FIG. 2E is a simulated of the mechanical energy flux of the combined eigenmode of the mechanical cavity and the waveguide.
FIG. 2F is a plot of mechanical damping of the phononic cavity as a function of the number of barrier holes separating the phononic cavity from the phononic waveguide.

The hybrid quantum system 150 may also include a microwave waveguide to guide the microwave photon from the SC qubit 160 to the piezoelectric transducer 174 and/or a phononic waveguide to couple the phonon from the piezoelectric transducer 174 to the mechanical mode of the cavity 176. This phononic waveguide be integrated into the phononic bus, e.g., as shown in FIG. 2A and discussed below. The couplings between the waveguide and the piezo-electric transducer 174 and the cavity 176 can be controlled, e.g., using electro-optic material in or at the edge of the waveguide, to achieve time-reversal symmetry, e.g., as in the "pitch-and-catch" scheme described below.

As described in greater detail below with respect to FIGS. 6A-6D, the strain-spin coupling can be mediated by a microwave drive from a microwave source 182, an optical Raman drive from a laser 184, or a time-varying magnetic field from an electromagnet 186, possibly with the aid of a bias magnetic field B generated by a permanent magnet (not shown). More specifically, the electromagnet 186 can tune a magnetic field that changes the spin eigenstates and thus changes their strain coupling. The microwave source 182 and/or laser 184 can be used for microwave and/or optical Raman dressing schemes that use a control field to essentially put the spin states on resonance with the strain (or not). In short, the microwave source 182, laser 184, and/or electromagnet 186 can tune the strain-spin coupling strength and so can be though of tunable couplers that control how a quantum state is transferred to (or from) the AAs 180. The microwave source 182, laser 184, and/or electromagnet 186 can also manipulate the spins, e.g., for generating photons or coupling to the nuclear spin states of other atoms (e.g., $^{13}C$ atoms) in the material defining the cavity 176.

The fidelity of the quantum state transfer from phonon to spin encoding can be sped up, or improved, by strain concentration (e.g., through thinner diamond patterning), using AAs with increased strain coupling, state distillation, and using pre-prepared spin Greenberger-Horne-Zeilinger (GHZ) states. A GHZ state prepared in advance of the SC-to-spin transduction would speed up the controlled phase gates by a factor of N for a N-spin GHZ state. Using a GHZ-spin state is beneficial if its decoherence rate, which is N times faster than the single-spin decoherence rate $\gamma_e$, is much slower than the phonon decoherence rate, i.e., $N\gamma_e \gg \gamma_p$. With coherence times of color center spins already exceeding one minute for the nitrogen vacancy (NV)-diamond system and expected to be very long also for group-IV vacancy centers at low enough temperature where phonon-mediated dephasing between the ground state orbitals is quenched, this regime may soon become accessible. Then, combined with local gates acting on the spins and the phonon, a GHZ state could significantly boost the speed and fidelity of a SWAP gate.

A Model of the Quantum-State Transduction

To estimate the state-transfer fidelity, we model the quantum state transfer from the SC qubit to the electron-spin qubit using the quantum-master-equation approach. As in FIGS. 1A and 1B, the SC qubit is directly coupled to a discrete mechanical mode of a phononic cavity via a tunable electromechanical transducer. (The SC qubit can also be coupled to the mechanical mode via an interaction mediated by guided modes of a microwave or phononic waveguide as described below. These guided modes mediate the state transfer between the SC qubit and the discrete phononic mode.) The couplings into and out of the waveguide are time-modulated to release ("pitch") and later receive ("catch") a wavepacket of propagating waveguide modes. Finally, the strain of the mechanical mode interacts with spin levels of the electronic fine-structure states of a diamond AA. By controlling this coupling, the quantum state is transduced to the spin state of the AA electron.

We start our theoretical description from the Hamiltonian schematically depicted in FIG. 1A:

$$H_{sc-e} = \hbar\omega_{sc}\sigma_{sc}^\dagger\sigma_{sc} + \hbar\omega_p b^\dagger b + \hbar\omega_e \sigma_e^\dagger \sigma_e + \hbar g_{sc-p}(t)(\sigma_{sc}b^\dagger + \sigma_{sc}^\dagger b) + \hbar g_{p-e}(t)(\sigma_e b^\dagger + \sigma_e^\dagger b). \quad (1)$$

Here $\sigma_{sc}$ ($\sigma_{sc}^\dagger$) is the superconducting qubit two-level lowering (raising) operator, $\sigma_e$ ($\sigma_e^\dagger$) is the electron spin lowering (raising) operator, and $b$ ($b^\dagger$) is the annihilation (creation) operator of the phonon. The frequencies $\omega_{sc}$, $\omega_p$, and $\omega_e$ correspond to the SC, phonon, and electron-spin excitations, respectively. The SC couples to the phonon mode via the coupling rate $g_{sc-p}$, and the phonon couples to the electron spin via $g_{p-e}$. The operators $\sigma_{sc}$ ($\sigma_{sc}^\dagger$) describe the SC system in a two-level approximation and can be identified with the annihilation (creation) operators of the qubit flux appearing in the circuit cavity-QED description of the device. Here, we assume that the effective couplings in the system are resonant and thus $\omega_{sc} = \omega_p = \omega_e$.

We consider system losses by adding into the Liouville equation of motion for the density matrix $\rho$ the Lindblad superoperators $\gamma_{c_i}\mathcal{L}_{c_i}(\rho)$:

$$\frac{d}{dt}\rho = \frac{1}{i\hbar}[H_{sc-e}, \rho] + \sum_i \gamma_{c_i}\mathcal{L}_{c_i}(\rho), \text{ where} \quad (2)$$

$$\gamma_{c_i}\mathcal{L}_{c_i}(\rho) = \frac{\gamma_{c_i}}{2}(2c_i\rho c_i^\dagger - \{c_i^\dagger c_i, \rho\}),$$

with $c_i \in \{\sigma_{sc}, b, \sigma_e^\dagger\sigma_e\}$ and $\gamma_{c_i} \in \{\gamma_{sc}, \gamma_p, \gamma_e\}$ representing the decay and decoherence rates, respectively, of the respective excitations. The Lindblad superoperators $\mathcal{L}_{c_i}(\rho)$ and $\mathcal{L}_b(\rho)$ describe the $T_1$ processes including the qubit decay, whereas $\mathcal{L}_{\sigma_e^\dagger\sigma_e}(\rho)$ describes pure dephasing of the electron spin (a $T_2$ process) considering the long-lived character of the spin excitation. The pure dephasing ($T_2$) processes of the SC qubit and the mechanical mode are not included. Instead, we consider rates of the $T_1$ processes corresponding to the experimentally achievable $T_2$ times (since $T_1 \sim T_2$ for phonons and SC qubits). We do not include thermal occupation of modes as the system is cooled to temperatures on the order of milliKelvins. While the system is taken to be in thermal equilibrium with the dilution refrigerator bath, non-equilibrium excitations can occur in certain systems, perhaps from stray infrared photons. For simplicity, we ignore these non-equilibrium excitations but note that they could potentially complicate the dynamics if they cannot be eliminated.

For high-fidelity state transfer without coherent reflections, the magnitude of the Jaynes-Cummings couplings $g_{p-e}$ and $g_{sc-p}$ should be switched in a sequence that allows for step-wise transfer of the quantum state to the mechanical mode and finally to the electron spin. To that end, we first switch on the coupling $g_{sc-p}$ between the SC qubit and the mechanical mode while turning off the phonon-electron-spin coupling $g_{p-e}$. After completing the state transfer to the mechanical mode, we switch off $g_{sc-p}$ and apply a state-transfer pulse $g_{p-e}$, completing the procedure. Each of the pulses represents a SWAP gate (up to a local phase), so the state-transfer protocol can be inverted by interchanging the pulse order. In particular, we assume that each coupling has a smooth time dependence given by $$g_{sc-p}(t) = g_{scp}\text{sech}(2g_{scp}[t - \tau_{scp}]) \quad (4)$$

$$g_{p-e}(t) = g_{pe}\text{sech}(2g_{pe}[t - \tau_{pe}]), \quad (5)$$

where $g_{scp}$ and $g_{pe}$ are the time-independent amplitudes and $\tau_{scp}$ and $\tau_{pe}$ are the time delays of the respective pulses. We choose the smoothly varying pulses over rectangular pulses to account for the bandwidth-limitation of experimentally achievable time-dependent couplings. In our simulations, we set $\Delta_{sc-p-e} = \tau_{pe} - \tau_{scp}$ to optimize the state-transfer fidelity $\mathcal{F}$, which is defined as:

$$\mathcal{F} = |Tr\{\sqrt{\sqrt{\rho_i}\rho_f\sqrt{\rho_i}}\}|, \quad (6)$$

where $\rho_i$ ($\rho_f$) is the density matrix of the initial state of the SC qubit (final state stored in the electron spin). Due to the finite simulation time, we further approximate the ideal infinite time spread of the applied pulses and apply the pulses at a sufficient delay after the start of the simulation.

SC Transducer Parameterization

The values of the coupling and loss parameters govern the system performance. Coupling rates between a microwave (MW) resonator resonantly coupled to a discrete phononic mode via a piezoelectric coupler can reach up to about 100 MHz. Optimizing the coupling involves matching the MW line impedance with the phonon waveguide impedance. For tunable coupling between the SC qubit and the mechanical mode of the cavity, the MW resonator can be substituted by the SC qubit itself. Using an additional Josephson junction with externally controllable flux as a tunable microwave switch mated to the piezoelectric coupler additionally enables controllable time-varying coupling between the SC qubit and the phonon. The coupling between the SC qubit and the mechanical mode can reach up to $g_{scp}/(2\pi)=50$ MHz. The SC qubit coherence times can be on the order of microseconds ($(g_{sc}/(2\pi)=10$ kHz), while the SC coherence times can be up to milliseconds.

Spin-Strain Transducer Parameterization

The spin qubit stored in the quantum memory is formed by the two low-energy fine-structure states of the AA (e.g., SiV⁻). These two states have distinct orbital and spin characters, which impedes direct coupling of the spin-qubit transition to either strain or magnetic fields. Generally, a combination of applied strain and magnetic field is used to address the SiV⁻ spin qubit. The spin-strain coupling is controlled via locally applied time-dependent magnetic fields to realize an effective controllable Jaynes-Cummings interaction [see Eq. (5)].

Several strategies have been devised to engineer the effective spin-strain coupling that generally rely on the application of externally controllable time-dependent magnetic fields and pulsed optical drives. These approaches are perturbative in character. This perturbative character may reduce the resulting effective spin-strain coupling $g_{pe}$ with respect to the bare strain coupling measured for fine-structure spin-allowed transitions $g_{orb}$ to $g_{pe} \approx 0.1\ g_{orb}$. The spin-strain interaction of group-IV quantum emitters in diamond has been measured at 1 PHz/strain. For an efficient state transfer between the mechanical mode and the electron-spin states, the spin-mechanical coupling $g_{orb}$ should be approximately $g_{orb}/(2\pi) \approx 10$ MHz (leading to the effective phonon-electron-spin $g_{orb}/(2\pi) \approx 1$ MHz). This can be achieved with a mechanical resonance with a zero-point strain of about $10^{-9}$ to about $10^{-8}$ and a high quality factor, e.g., about $10^4$, $10^5$, $10^6$, or higher.

Mechanical Cavity for Strong Phonon-Spin Coupling

The phononic bus may include or be coupled to a mechanical cavity that allows fast and efficient phonon-mediated quantum-state transduction to and from the electron spin. These cavities can be modeled through a series of finite-element numerical simulations (performed using Comsol Multiphysics) of the mechanical resonance within the continuum description of elasticity. These simulations presented here use absorbing perfectly matched layers at the boundaries. The optical response of the diamond cavity can be obtained from a solution of Maxwell's equations in the materials described via their linear-response dielectric function.

FIGS. 2A-2F and 3A-3C illustrate two different types high-Q mechanical cavities suitable for use in a phononic bus in a hybrid quantum system. These cavities have zero-point strain fields that give rise to the phonon-spin strong coupling used in the transduction scheme. The first type of cavity, shown in FIG. 2A, is a silicon resonator or cavity 230 with a thin (e.g., 100 nm) diamond layer 202 heterogeneously integrated on a silicon substrate 204. This takes advantage of mature design and fabrication of silicon nanophononics, exceptionally small decoherence rates of microwave frequency phonons in suspended single-crystal silicon, and new techniques in heterogeneous integration of diamond nanoscale membranes. The second type of cavity, shown in FIG. 3A, is an all-diamond optomechanical resonator or cavity 300 that at the same time supports an optical and phononic mode for mechanical and optical addressing of the electron spin.

As depicted in FIG. 2A, the silicon cavity 230 contains a silicon vacancy and is embedded in a phononic crystal 200 to reduce the cavity loss. The cavity 230 is also weakly coupled to a phononic waveguide 210 that mediates the interaction of the cavity with the SC circuit (not shown). Simultaneous acoustic and microwave electrical impedance matching can be achieved with wavelength-scale structures using thin piezoelectric films, enabling coupling into the waveguide 210 from the SC system with low insertion loss. The cavity 230 is separated from the waveguide 210 by a series of barrier holes 220 to allow tuning the coupling rate between the discrete cavity mode and the guided phonons. FIG. 2B shows this cavity 230 in greater detail. The silicon platform 204 forming the base of the cavity 230 is covered with a thin layer (100 nm) of diamond 202 hosting the silicon vacancies (spin defects).

To analyze the cavity mechanical properties, we calculate the distribution of the elastic energy density of a mechanical mode of the cavity 230 resonant at $\omega_p/(2\pi) \approx 2.0$ GHz. The energy density is concentrated in the thin constriction formed by the diamond layer 202 for efficient phonon-spin coupling. FIG. 2D shows the calculated bare phonon-spin coupling $g_{orb}=(\epsilon_{xx}-\epsilon_{yy})d$ corresponding to the strain field in the ground state of the resonator—the zero-point strain. Here d≈1/strain is the strain susceptibility of the defect electron spin, and $\epsilon_{xx}$ ($\epsilon_{yy}$) are the components of the zero-point strain expressed in the coordinate system of the defect. As shown in FIG. 2D, $g_{orb}/(2\pi)$ reaches up to 5.4, indicating an effective coupling $g_{pe}/(2\pi) \approx 0.5$ MHz.

Another figure of merit characterizing the cavity performance is the cavity coupling to the waveguide modes. The distribution of the mechanical energy flux in the cavity in FIG. 2E shows that the cavity mode interacts with the waveguide modes, introducing a decay rate $\kappa_p$ of the cavity mode. FIG. 2F shows this decay rate as a function of the number of barrier holes 220 on a logarithmic scale. The decay rate decreases exponentially with the number of separating barrier holes 220 from almost $10^7$ to about 1 for seven barrier holes 220. For larger number of barrier holes 220, the cavity lifetime becomes practically limited by the material properties of silicon and diamond and could be as low as about 0.1 assuming no additional loss due to the introduction of the diamond nanomembrane.

FIGS. 3A-3C show the all-diamond optomechanical cavity 300, which includes a diamond beam 310 with an array of elliptical holes 320 of different sizes. (The cavity geometry in FIG. 3A is artificially distorted along the coordinate of the mechanical mode for emphasis.) The hole array 320 simultaneously produces a phononic and photonic cavity that concentrates both the mechanical strain of the phononic mode and the optical electric field of the electromagnetic mode on an AA 330 in the cavity center. The distribution of the elastic energy density of a phononic mode of frequency $\omega_p/(2\pi) \approx 17.2$ GHz shown in FIG. 3A reveals that the mechanical energy is dominantly concentrated around the center of the beam.

FIG. 3B shows the achievable bare coupling strength $g_{orb}$ calculated using values of zero-point strain of this mode. The achievable effective phonon-spin qubit coupling in the diamond cavity thus reaches up to $g_{pe}/(2\pi) \approx 0.1\ g_{orb}/(2\pi)=$ 2.4 GHz. This diamond cavity 300 furthermore offers the possibility to increase the efficiency of optical addressing of the diamond AAs 330 by concentrating light of a vacuum wavelength $\lambda_{opt}=732$ nm into an optical mode that is spatially overlapping with the cavity mechanical mode. The high calculated optical quality factor $Q_{opt}=10^6$ can be used to increase the efficiency of optical addressing of the diamond AA 330 as discussed below.

Numerical Analysis of SC-Emitter Quantum State Transfer

As discussed above, mechanical resonators of quality factors of $Q>10^7$ have been demonstrated experimentally. The limiting time-scale for high-fidelity state transfer is the decoherence of the SC and electron spin qubits, so the SC population should be transferred rapidly into the phononic mode. The long-lived phonon then allows transduction into the AA electron spin levels of the emitter, where the qubit can be addressed optically, or is further transferred to the quantum memory—the nuclear spin.

FIG. 4A shows the time evolution of the state transfer between the SC and electron spin qubits in a hybrid quantum system according to a numerical evaluation of the master equation. In this simulation, $g_{scp}/(2\pi)=50$ MHz, $g_{pe}/(2\pi)=1$ MHz, $\gamma_{sc}/(2\pi)=10$ kHz, $\gamma_p/(2\pi)=100$ Hz, and $\gamma_e/(2\pi)=10$ kHz. The SC qubit is initialized in the excited state while the rest of the system is considered to be in the ground state. The system evolves in time, with control pulses [Eqs. (4) and (5) shown in FIG. 4B as a solid line and a dashed line, respectively] applied to transfer the initial population of the SC qubit (solid line) sequentially to the phonon (dashed line), and the electron spin (dash-dotted line), as shown in FIG. 4A. On the SC qubit end, the control pulses actuate the tunable coupler connecting the SC qubit to the piezoelectric transducer. And on the AA qubit end, the pulses may be magnetic field or optical or microwave Raman control fields that control the spin-strain coupling strength.

FIGS. 4C and 4D illustrate the state-transfer fidelity $\mathcal{F}$ defined in Eq. (6) the infidelity $\log(1-\mathcal{F})$, respectively, as a function of the phonon-spin coupling rate $g_{pe}$ and the electron-spin dephasing rate $\gamma_e$. We vary $g_{pe}/(2\pi)$ from 100 kHz, representing a conservative estimate of the phonon-spin coupling rate, to 10 MHz, which exceeds the estimated value for the silicon phononic cavity by an order of magnitude. We set $\gamma_p/(2\pi)$ to 100 Hz (i.e., we consider a high-quality resonance of the phononic cavity), with a conservative upper bound on the electron-spin dephasing rate $\gamma_e/(2\pi)$ of 100 kHz, although this could be lowered to 1 kHz thanks to progress in quantum technology. For high transfer fidelity (infidelity of less than ~1%), the phononic cavity should have a high quality factor and the electron-spin decoherence rate should not exceed about 10 kHz, which is well within the experimentally accessible range.

Quantum Interfacing

The AA electron-spin qubit can serve as a network bus, mediating coupling to not just phonons as well as photons and nuclear spins. In particular, the spin-dependent optical transitions enable photon-mediated coupling of the quantum device to, for example, distant quantum memories in a quantum network, as illustrated in FIG. 1A. Spin-to-photon conversion can be performed by optically addressing the electron spin after the SC qubit has been transduced to it. This could be performed via a variety of spin-photon interfacing procedures, including direct optical excitation of the quantum emitter, or a spin-photon controlled-phase gate mediated by a cavity mode. However, the fidelity of this approach may be limited by the achievable emitter-cavity cooperativity and the detuning between spin states, e.g., to entanglement fidelities of 0.94 and heralding efficiencies of 0.45. The photon loss associated with this direct spin-to-photon transduction also destroys the quantum state that was to be transported.

An alternative approach transmits the superconducting qubit with near-unity efficiency and fidelity, using deterministic state teleportation to a distant target qubit in a quantum network. In this approach, a $^{13}$C nuclear spin, hyperfine coupled to the SiV electron spin, is entangled with the quantum network target qubit by repeat-until-success optical heralding. The SC qubit is then transduced into the SiV electron spin system by the procedure described above. Finally, a Bell-state measurement of the nuclear and electron spins followed by a feed-forward single-qubit gate completes the teleportation of the nuclear spin qubit to the quantum network target. This scheme does not transduce the SC qubit to the optical domain and thus avoids photon transmission losses. Instead, electron-nuclear spin gates can be used to teleport the qubit across a quantum network. This second approach can achieve near-unity state-transfer fidelity and efficiency provided that entangled qubit pairs shared between nodes of the quantum network can be prepared on demand. This preparation of on-demand entanglement has been recently realized for diamond NV centers with spin-spin teleportation fidelities reaching up to 0.84. Ongoing experimental and theoretical advances promise to enable near-unity teleportation fidelity, including through environmentally-insensitive quantum emitters (such as the SiV in the quantum memory of the hybrid quantum system) and entanglement schemes to improve noise- and error-resilience.

The hyperfine interactions of the electron spin with nearby spins of nuclear isotopes is often an unwanted source of electron-spin decoherence hindering the ability to maintain and control the electron-spin qubits over long time scales. Dynamical decoupling techniques have been applied to mitigate this decoherence and reach about 1 ms to about 10 ms coherence times in SiV systems. However, recent theoretical and experimental work shows that the nuclear spins can be used as a resource as their quantum state can be selectively addressed and controlled via the quantum state of the electron spin itself with high fidelity. Combined with the extraordinarily long (exceeding about 1 second) coherence times of these nuclear spins, the nuclear-spin bath could serve as a quantum register and could store quantum states and thus serve as a QM. A suitable protocol can implement a quantum SWAP gate allowing for state transfer from the electron-spin qubit to a single nuclear spin of a nearby $^{13}$C atom. Assuming electron-spin pure dephasing of $\gamma_e/(2\pi)=10$ kHz, nuclear-spin pure dephasing of $\gamma_n/(2\pi)=1$ Hz, a moderate electron-spin hyperfine coupling $A_\parallel=500$, and a conservative value of an external microwave drive Rabi frequency $\Omega_{mw}/(2\pi) \approx 3.9$ kHz, the state-transfer fidelity of this process could reach $\mathcal{F}_{en} \approx 0.9975$.

The compactness of this diamond QM further opens up the possibility to scale the system. Using a mechanical or microwave switching network, each SC qubit could be selectively coupled to a large number of mechanical cavities depending on the experimental architecture. As each additional coupled cavity introduces a decay channel, low-loss high-isolation switching is required. As an example, the hybrid quantum system could operate according to a pitch-and-catch scheme where the quantum state is launched into a mechanical waveguide with controllable coupling to many phononic resonators. For high fidelity state transfer $\mathcal{F} > 0.99$, the total insertion loss of all switches should be below 0.04 dB. Considering experimentally achievable AA densities, about 10 AAs could be individually addressed within the mechanical mode volume of ~$10^7$ nm$^3$ of each waveguide. These can be individually optically addressed due to their inhomogeneous optical and microwave transition distribution, induced by natural variations in local static strain within the diamond crystal.

Each color center (AA) enables high-fidelity coupling to about 10 nuclear spins. Allowing for 10 parallel QM interconnects from the QPU would thus provide a total QM capacity of about ~10×10×10=kqubits. Introducing spatial multiplexing (e.g., using microwave switches) further increases the QM capacity.

A hybrid quantum system coupling a large number of electron-spin qubits to a shared mechanical mode further opens the opportunity for efficient phonon-mediated spin-entangling quantum gates. These gates enable preparation of highly entangled many-spin states, such as the Greenberger-Horne-Zeilinger (GHZ) state, that can serve as resources for further quantum-state manipulation. Specifically, an N-electron-spin GHZ state coupled to the same phononic cavity could increase the phase sensitivity to strain N-fold. Thus, a GHZ state prepared in advance of the SC-to-spin transduction would speed up the controlled phase gates, with an N-fold speed increase for an N-spin GHZ state. Combined with local gates acting on the spins and the phonon, a GHZ state could be used to boost the speed and fidelity of the SWAP gate.

Transduction from an SC Qubit to a Spin Qubit via a Waveguide

As discussed above, the SC qubit can be electro-mechanically coupled directly to a phononic cavity. Alternatively, the mechanical mode of the phononic cavity can be coupled to the microwave circuit via a microwave or phononic waveguide. For example, this waveguide may serve as an interconnect between a SC qubit of a quantum computer that is physically separated from the phononic cavity across large distance, or it might represent a guided phonon wave connecting a piezoelectric coupler (interdigital coupler (IDT)) with a discrete high-Q mechanical mode of a phononic cavity surrounded by a phononic crystal. In either case, the qubit stored in the SC device can be transfer to the spin using the 'pitch-and-catch' state transfer of the SC state to the mechanical resonator via the waveguide. The transduction of the quantum state stored in the phonon into the electron spin via an effective Jaynes-Cummings interaction can be performed as described above.

FIG. 5A illustrates coupling of the SC qubit to the guided modes of the waveguide, which is electro-mechanically coupled to the phononic cavity (or, alternatively, to a phononic waveguide mechanically coupled to a discrete mechanical mode of a cavity). Such a system can be described by the following Hamiltonian:

$$H_{sc-m-p} = \hbar\omega_{sc}\sigma_{sc}^\dagger\sigma_{sc} + \hbar\omega_p b^\dagger b + \sum_k \hbar\omega_k a_k^\dagger a_k + \sum_k \hbar g_{sc-m}(t)(\sigma_{sc}^\dagger a_k + \sigma_{sc} a_k^\dagger) + \sum_k \hbar g_{m-p}(t)(b^\dagger a_k + b a_k^\dagger).$$

where $a_k$ ($a_k^\dagger$) are the annihilation (creation) operators of a waveguide mode k of frequency $\omega_k$. The SC qubit and the mechanical mode are coupled to the waveguide via controllable time-dependent couplings $g_{sc-m}$ and $g_{m-p}$, respectively. The coupling $g_{m-p}$ can be realized either as a tunable IDT couple, or as a tunable mechanical interconnect, e.g., based on interferometric modulation of coupling in analogy with optical implementations.

The quantum state stored in the SC device can be released into the waveguide and subsequently absorbed by the phononic cavity. To accomplish the pitch-and-catch state transfer with high fidelity, the phonon emission by the SC qubit and phonon absorption by the phononic cavity should be mutually time-reversed. To that end, the pulse emitted by the SC qubit should be time-symmetrical and the couplings should fulfill the relation $g_{sc-m}(t)=g_{m-p}(-[t-\tau])$, where $\tau$ is the delay time due to the finite length of the waveguide.

For concreteness, the waveguide has a length L and supports phononic or electromagnetic modes of the form $\propto \cos(k_j x)$, with $k_j=(N_0+j)\pi/L$ and x being a position along the waveguide. $N_0$ is a mode number that, in connection with the waveguide length L and the mode velocity c (assuming a linear dispersion), determines a central frequency of the selected set of modes. This function may represent a vector potential in a MW transmission line or a mechanical displacement of a phononic wave. The free spectral range of this finite waveguide is $\delta=c\pi/L$ and the spontaneous decay rate of each qubit into the waveguide modes occurs with the rate (assuming time-independent $g_{sc-m}=g_{mp}\equiv g_{qm}$):

$$\kappa_{sc} = \frac{2\pi g_{q-m}^2}{\delta}.$$

The objective of releasing a perfectly symmetrical microwave pulse in a form proportional to $\text{sech}(\kappa_{sc}t/2)$ can be achieved by modulating the coupling constant in time via an electromechanical coupler:

$$g_{sc-m}(t) = g_{qm}\sqrt{\frac{e^{\kappa_{sc}t}}{1+e^{\kappa_{sc}t}}},$$

The wave packet released by the superconducting qubit can be fully absorbed by the phononic cavity if the time-reversed delayed coupling is:

$$g_{m-p}(t) = g_{qm}\sqrt{\frac{e^{\kappa_{sc}(t-\tau)}}{1+e^{\kappa_{sc}(t-\tau)}}}.$$

FIGS. 5B-5D illustrate the pitch-and-catch scheme. FIG. 5B shows the time-dependence of the populations of the SC qubit (solid line), the phonon (dashed line), and the MW photon in the waveguide (dash-dotted line). As shown, the pitch-and-catch scheme leads to an almost perfect transfer of population from the SC qubit to the phonon (the normalized final phonon population is about 1). FIG. 5C shows the sequence of time-dependent couplings, beginning with release of a fully symmetrical propagating wave packet by actuating the tunable coupler controlling the coupling from the SC qubit. (FIG. 5D shows a snapshot of the photon intensity as a function of position along the waveguide.) This wave packet is subsequently perfectly absorbed by the receiving qubit.

The model outlined above can be cast into the form of a master equation for the density matrix $\rho_{scp}$ describing the SC qubit and the phononic cavity in the single-excitation basis, but only effectively accounting for the modes of the MW waveguide:

$$\frac{\partial \rho_{scp}}{\partial t} =$$
$$-\frac{1}{\hbar}[H_{sc}+H_p, \rho_{scp}] + \kappa_{sc}(t)\mathcal{L}_{\sigma_{sc}}(\rho_{scp}) + \gamma_{sc}\mathcal{L}_{\sigma_{sc}}(\rho_{scp}) + \kappa_p(t)\mathcal{L}_b(\rho_{scp}) +$$
$$\gamma_p\mathcal{L}_b(\rho_{scp}) + \sqrt{\kappa_p(t)\kappa_{sc}(t)} \times (e^{i\phi}[\sigma_{sc}\rho_{scp}, b^\dagger] + e^{-i\phi}[b, \rho_{scp}\sigma_{sc}^\dagger]),$$

with $H_{sc}=\hbar\omega_{sc}\sigma_{sc}^\dagger\sigma_{sc}$ and $H_{sc}=\hbar\omega_p b^\dagger b$. The density matrix of the phonon is evaluated at a later time t+τ (in the following, τ=0 seconds for simplicity) and the phase accumulated due to the propagation of the photon wave packet is absorbed in the definition of $\phi$. The respective time-dependent decay rates are given by:

$$\kappa_{sc} = \frac{2\pi g_{sc-m}^2(t-\tau_{pc})}{\delta},$$
$$\kappa_p = \frac{2\pi g_{m-p}^2(t-\tau_{pc})}{\delta},$$

The pulses are applied at a later time $\tau_{pc}$ to ensure smooth dynamics. FIG. 5E shows that the resulting time-dependent populations perfectly capture the pitch-and-catch scheme described above in the framework of Schrödinger equation (cf. populations in FIG. 5B).

By effectively eliminating the waveguide, the waveguide propagation losses that could further decrease the state-transfer fidelity can be neglected. Nevertheless, for phonon decay rates of about 1 Hz achieved in state-of-the-art acoustical systems, a speed of sound c~$10^3$ m/s, and waveguide length L~1 mm, the propagation losses are so small to result in near-unity transmission ~$e^{-10^{-6}}$≈0.999999. FIG. 5E shows the result of integrating the master-equation description above of the pitch-and-catch scheme (i.e., for $\partial\rho_{scp}/\partial t$) to describe the full dynamics of the state transfer from the SC qubit to the electron spin.

Effects of Strain on SiV Negative Center

The effects of strain on a SiV⁻ center have been considered in the literature theoretically and experimentally. The theory predicts that the strain effects can be divided into three categories according to the transformation properties of the strain field under symmetry operation of the $D_{3d}$ symmetry group. based on symmetry, the strain can be classified as $\epsilon_{A_{1g}}$, $\epsilon_{E_{gx}}$, and $\epsilon_{E_{gy}}$. These strain components then give rise to the longitudinal, α, and transverse, β and γ, strain coupling to the spin-orbit states of the color center:

$$\alpha = t_\perp(\epsilon_{xx}+\epsilon_{yy}) + t_\parallel \epsilon_{zz} \sim \epsilon_{A_{1g}},$$
$$\beta = d(\epsilon_{xx}-\epsilon_{yy}) + f\epsilon_{xx} \sim \epsilon_{E_{gx}},$$
$$\gamma = -2d(\epsilon_{xy}) + f\epsilon_{yz} \sim \epsilon_{E_{gy}},$$

where z is oriented along the high-symmetry axis of the defect [111], x is oriented along [$\bar{1}\bar{1}2$], and y is defined by [$\bar{1}10$]. The respective values of the constants $t_\parallel$, $t_\perp$, d, and f have been estimated to be in the range of 1 PHz to 2 PHz (we transform the relevant tensor components into the coordinate system defined by [100], [010], and [001] below). These values can be used to estimate the constants for designing a potential transducer. The $A_{1g}$ strain uniformly shifts the fine-structure-state energies, so its effects are disregarded in the following discussion.

Consider that the Hamiltonian of the fine-structure states of a SiV⁻ in a longitudinal magnetic field is (neglecting the Jahn-Teller effect and the Orbital Zeeman effect, for simplicity):

$$H_{tot} = \begin{pmatrix} B_z\gamma_s & 0 & -i\lambda & 0 \\ 0 & -B_z\gamma_s & 0 & i\lambda \\ i\lambda & 0 & B_z\gamma_s & 0 \\ 0 & -i\lambda & 0 & -B_z\gamma_s \end{pmatrix}.$$

The Hamiltonian is expressed in the basis of spin-orbit states $\{|e_y\uparrow\rangle, |e_y\downarrow\rangle, |e_x\uparrow\rangle, |e_x\downarrow\rangle\}$. Here λ is the spin-orbit coupling strength ($\lambda/(2\pi\hbar)\approx 23$ GHz), $B_z$ is the magnetic field applied along the high-symmetry axis of the defect, and $\gamma_s/(2\pi)\approx 28$ GHz/T is the spin gyromagnetic ratio. The Hamiltonian in the preceding equation can be diagonalized to obtain the eigenfrequencies:

$$v_1 = -B_z\gamma_s - \lambda,$$
$$v_2 = -B_z\gamma_s + \lambda,$$
$$v_3 = B_z\gamma_s + \lambda,$$
$$v_4 = B_z\gamma_s - \lambda,$$

and the corresponding eigenstates:

$$|\psi_1\rangle = \frac{1}{\sqrt{2}}(-i|e_y\downarrow\rangle + |e_x\downarrow\rangle),$$
$$|\psi_2\rangle = \frac{1}{\sqrt{2}}(i|e_y\downarrow\rangle + |e_x\downarrow\rangle),$$
$$|\psi_3\rangle = \frac{1}{\sqrt{2}}(-i|e_y\uparrow\rangle + |e_x\uparrow\rangle),$$
$$|\psi_4\rangle = \frac{1}{\sqrt{2}}(i|e_y\uparrow\rangle + |e_x\uparrow\rangle),$$

FIG. 6A illustrates the structure of the fine-structure states. The two lowest-energy states $|\psi_4\rangle$ and $|\psi_1\rangle$ can be conveniently used as the spin-qubit states. In this basis the transverse-strain Hamiltonian becomes:

$$H_\beta = \begin{pmatrix} 0 & \beta & 0 & 0 \\ \beta & 0 & 0 & 0 \\ 0 & 0 & 0 & \beta \\ 0 & 0 & \beta & 0 \end{pmatrix}$$

and $$H_\gamma = \begin{pmatrix} 0 & i\gamma & 0 & 0 \\ -i\gamma & 0 & 0 & 0 \\ 0 & 0 & 0 & i\gamma \\ 0 & 0 & -i\gamma & 0 \end{pmatrix},$$

where β and γ are the strain components given above. The spin degree of freedom thus cannot be flipped by the sole application of a transverse strain. Considering that the transition $|\omega_1\rangle \leftrightarrow |\psi_4\rangle$ is spin-forbidden and the states $|\psi_1\rangle$ and $|\psi_4\rangle$ have distinct orbital character, applying a combination of a transverse magnetic field and strain couples to the spin qubit. We next consider possible scenarios that allow the transition $|\psi_1\rangle \leftrightarrow |\psi_4\rangle$ including (i) the application of a quasi-static magnetic field, (ii) a microwave drive, and (iii) an optical Raman scheme.

Quasi-Static Magnetic Field

To allow the spin-qubit states to couple to strain we add to the system a perturbation in the form of an x-polarized magnetic field:

$$H_{B_z} = \begin{pmatrix} 0 & 0 & B_x \gamma s & 0 \\ 0 & 0 & 0 & B_x \gamma s \\ B_x \gamma s & 0 & 0 & 0 \\ 0 & B_x \gamma s & 0 & 0 \end{pmatrix}.$$

In the lowest order of perturbation theory, this Hamiltonian causes the following modification to the system eigenstates:

$$|\psi'_1\rangle \approx |\psi_1\rangle + \frac{B_x \gamma s}{v_1 - v_3} |\psi_3\rangle,$$

$$|\psi'_2\rangle \approx |\psi_2\rangle + \frac{B_x \gamma s}{v_2 - v_4} |\psi_4\rangle,$$

$$|\psi'_3\rangle \approx |\psi_3\rangle + \frac{B_x \gamma s}{v_3 - v_1} |\psi_1\rangle,$$

$$|\psi'_4\rangle \approx |\psi_4\rangle + \frac{B_x \gamma s}{v_4 - v_2} |\psi_2\rangle.$$

The two lowest-lying spin states $|\psi_4\rangle$ and $|\psi_1\rangle$ are therefore modified to $|\psi'_4\rangle$ and $|\psi'_1\rangle$, which can be coupled via strain. In particular, in the lowest order of perturbation theory, this coupling can be estimated as:

$$\langle \psi'_4 | H_\beta | \psi'_1 \rangle \approx \beta \left( \frac{B_x \gamma s}{v_1 - v_3} + \frac{B_x \gamma s}{v_4 - v_2} \right) = \beta \left( \frac{B_x \gamma s}{-2B_z \gamma s - 2\lambda} + \frac{B_x \gamma s}{2B_z \gamma s - 2\lambda} \right).$$

Similarly, for the $\gamma$ component of strain we obtain:

$$\langle \psi'_4 | H_\gamma | \psi'_1 \rangle \approx -i\gamma \left( \left( \frac{B_x \gamma s}{v_1 - v_3} + \frac{B_x \gamma s}{v_4 - v_2} \right) \right) = -i\gamma \left( \frac{B_x \gamma s}{-2B_z \gamma s - 2\lambda} + \frac{B_x \gamma s}{2B_z \gamma s - 2\lambda} \right).$$

Based on our simulations, we further consider $\beta/(2\pi) \sim 10$ MHz ($\gamma/(2\pi) \sim 10$ MHz) we obtain that the direct coupling of states $|\psi'_1\rangle$ and $|\psi'_4\rangle$, $g_{pe} = \Gamma_{pe} B_x$ is of the order $\Gamma_{pe}/(2\pi) \sim 5$ MHz/T. A moderate magnetic bias field of 0.2 T would achieve the coupling rate $g_{pe}/(2\pi) \sim 1$ MHz used in the state-transfer analysis. The frequency of the spin transition $|\psi'_1\rangle \leftrightarrow |\psi'_4\rangle$ can be tuned by an external field $B_z$ to achieve resonant spin-phonon interaction. The pulsed modulation of the coupling could be realized by modulating the value of the magnetic field $B_x(t)$.

Microwave Drive

Another way to induce the resonant interaction of the lowest lying spin states (states $|\psi_1\rangle$ and $|\psi_4\rangle$) considering that $\lambda$ is the dominant scale is to drive the spin transition between states $|\psi_4\rangle$ and $|\psi_1\rangle$ that are orbitally allowed via a microwave drive at the frequency $\omega_d$.

FIG. 6C shows this microwave drive scheme. The orbital transitions $|\psi_1\rangle \to |\psi_2\rangle$ and $|\psi_4\rangle \to |\psi_3\rangle$ are coupled to the acoustic phonon via the strain susceptibility with a rate $g_{orb} \approx 2\pi \times 10$ MHz. We further introduce the shorthand notation: $\sigma_{ij} = |\psi_i\rangle \langle \psi_j|$ and write the effective Hamiltonian of the system under consideration:

$$H_{sys} = \Delta \sigma_{22} + \omega_B \sigma_{44} + \Omega(t)(e^{i[\theta(t) + \omega_d t]} \sigma_{42} + H.c.) + g_{orb}(b^\dagger \sigma_{12} + H.c.) + \omega_p b^\dagger b. \quad (B22)$$

Here we neglect any influence of the off-resonant state $|\psi_3\rangle$, $\Delta = E_2 - E_1$, $\omega_B = E_4 - E_1$, $\omega_p$ is the phonon frequency, $b$ ($b^\dagger$) is the phonon annihilation (creation) operator, and $\Omega(t)$ and $\theta(t)$ are the amplitude- and phase-envelopes of the external microwave drive, respectively. The Hamiltonian in the preceding equation can be used to find an approximation in such a way that the Raman-mediated coupling of the two lowest spin states with the phonon can be made explicit. To that end, we first introduce the interaction picture given by the Hamiltonian:

$$H_{ip} = \omega_B \sigma_{44} + \Delta \sigma_{22} + \omega_p b^\dagger b.$$

This leads to the following rotating-frame Hamiltonian:

$$H_{rot} = \Omega(t)[\sigma_{42} e^{i[\theta(t) + (\omega_d + \omega_B - \Delta)]t} + H.c.] + g_{orb}[b^\dagger \sigma_{12} e^{i(\omega_p - \Delta)t} + H.c.].$$

We further set $\omega_d = \omega_p - \omega_B$ to ensure resonant drive.

Adiabatic elimination can be applied to this rotating-wave Hamiltonian to obtain the effective coupling constant between the phonon and the electron spin:

$$g_{p-e} \approx g_{eff}^{mw} = g_{orb} \frac{\Omega(t) e^{i\theta(t)}}{\delta},$$

with $\delta = \omega_p - \Delta$. To ensure the validity of the adiabatic approximation, we set $|\Omega| < |\delta|$ and estimate $g_{pe}/(2\pi) = g_{eff}^{mw}/(2\pi) \approx 0.1 g_{orb}/(2\pi) \approx 1$ MHz. The microwave drive employed in this scheme ensures the resonant character of the phonon-spin coupling and eliminates the necessity to tune the magnitude of the magnetic field $B_Z$ (i.e., of $\omega_B$).

Optical Raman Drive

FIG. 6D shows that an optical Raman drive can enable resonant coupling between the transition connecting the lowest-energy spin-orbit states and the cavity phonon. The Hamiltonian describing this Raman scheme, expressed in the basis of states perturbed by the magnetic field and an optically accessible excited state, $|E\uparrow\rangle$, can be written as:

$$H_{Raman} = \Delta \sigma'_{22} + \omega_B \sigma'_{44} + \omega_p b^\dagger b + \omega_E \sigma'_{EE} + \Omega_A (\sigma'_{2E} e^{i[\theta_A(t) + \omega_A t] + H.c.}) + \Omega_C (\sigma'_{4E} e^{i[\theta_C(t) + \omega_C t] + H.c.}) + g_{orb}(\sigma'_{12} b^\dagger + \sigma_{21} b),$$

where $\sigma'_{ij} = |\psi'_i\rangle\langle\psi'_j|$ and $|\psi'_E\rangle$ is an electronic excited state of SiV$^-$. Here, $\Omega_A$ and $\Omega_B$ are related to the amplitude of the two pumping lasers and are proportional to the dipole coupling elements between the respective states, and $\theta_A$ ($\theta_C$) are slowly varying phases. The respective laser-drive frequencies, $\theta_A$ and $\theta_C$, are adjusted so that $\omega_p = \omega_B + \omega_A - \omega_C$. Under such conditions, it is possible to obtain the following effective phonon-electron-spin coupling:

$$g_{p-e} \approx g_{eff}^{Raman} = \frac{\Omega_A e^{i\theta_A(t)} \Omega_C e^{-i\theta_C(t)} g_{orb}}{(\omega_p - \Delta)(\omega_C - \omega_E + \omega_p)}.$$

Since $g_{eff}^{Raman}$ has been obtained perturbatively, $\Omega_A \Omega_C / [(\omega_p - \Delta)(\omega_C - \omega_E + \omega_p)] \ll 1$, and the effective phonon-electron-spin coupling is thus substantially reduced. An advantage of this scheme is in the tunability of the externally applied lasers that can be used to rapidly adjust the condition for the resonant phonon-spin coupling or modulate the magnitude of the coupling strength. For this scheme to be efficient, the phonon frequency should be close to the transition frequency $\Delta$.

The different strain susceptibilities of the ground and excited electronic-state manifolds could also be used to induce the ground-state spin-strain coupling. This scheme has, for example, been used for a nitrogen-vacancy color center.

Coordinate Transformation of the Strain Tensor Components

Above we discuss the effects of strain on the fine-structure states of a SiV$^-$ color center and express the strain tensor in the internal system of coordinates of the color center defined with respect to the diamond crystallographic directions as: z along [111], x along [$\bar{1}\bar{1}2$], and y along [$\bar{1}10$]. However, it can be more natural to consider the strain tensor in the set of coordinates defined by the basis vectors of the diamond cubic lattice. For convenience, we therefore transform the relevant tensor components that yield electron-spin-phonon coupling into this natural coordinate system defined by the basis vectors of the diamond cubic lattice and use the numbered indexes 1, 2, and 3 to denote the coordinates [100], [010], and [001], respectively:

$$\epsilon_{xx} - \epsilon_{yy} = (-\epsilon_{11} - \epsilon_{22} + 2\epsilon_{33} + 2[\epsilon_{12} + \epsilon_{21}] - [\epsilon_{13} + \epsilon_{31}] - [\epsilon_{23} + \epsilon_{32}])/3$$

$$\epsilon_{zx} = -(\epsilon_{11} + \epsilon_{22} - 2\epsilon_{33} - 2\epsilon_{13} - 2\epsilon_{23} + \epsilon_{12} + \epsilon_{21} + \epsilon_{31} + \epsilon_{32})/(3\sqrt{2})$$

$$\epsilon_{xy} = \frac{\epsilon_{11} - \epsilon_{12} + \epsilon_{21} - \epsilon_{22} - 2\epsilon_{31} + 2\epsilon_{32}}{2\sqrt{3}}$$

$$\epsilon_{yz} = \frac{-\epsilon_{11} - \epsilon_{12} - \epsilon_{13} + \epsilon_{21} + \epsilon_{22} + \epsilon_{23}}{\sqrt{6}}.$$

This form is convenient to express the effect of strained diamond slab etched along the (100) crystallographic plane of diamond, e.g., in the design of the phononic cavity.

State Transfer from the Electron Spin to the Nuclear Spin

To complete the chain of state-transfer steps leading to the transduction of a state stored in an SC qubit to a nuclear-spin qubit, here is an example of a state-transfer protocol than can be applied to connect the electronic and nuclear-spin qubits.

The nuclear spin described by the Hamiltonian $$H_{nn} = \frac{\hbar\omega_L}{2}\sigma_z^n$$

is taken to be coupled to the electron spin via a longitudinal interaction:

$$H_{e-n} = \frac{A_{\parallel}}{4}\sigma_z^e\sigma_z^n,$$

where $\sigma_z^e$ and $\sigma_z^n$ are the electron-spin and nuclear-spin Pauli z operators, respectively. This interaction Hamiltonian is a result of a hyperfine interaction between the electronic and the nuclear spins. The nuclear spin is furthermore driven by a microwave field of frequency $\omega_{mw} = \omega_L + A_{\parallel}/2$, amplitude $\Omega_{mw}$, and adjustable phase $\theta_{mw}$:

$$H_{mw} = \Omega_{mw}[\sigma_n e^{i(\theta_{mw} + \omega_{mw}t)} + \sigma_n^{\dagger} e^{-i(\theta_{mw} + \omega_{mw}t)}].$$

This drive is conditionally resonant when the electron spin is in state $|1_e\rangle$ and is off-resonant when the electron is in $|0_e\rangle$. After transforming the total Hamiltonian $H_{nn} + H_{e-n} + H_{mw}$ into an interaction picture and considering the conditional character of the drive yields the effective Hamiltonian $H_{en}$:

$$H_{en} = -\hbar A_{\parallel}|\sigma_n^{\dagger}\sigma_n|0_e\rangle\langle 0_e| + \hbar\Omega_{mw}[\cos(\theta_{mw})\sigma_x^n + \sin(\theta_{mw})\sigma_y^n]|1_e\rangle\langle 1_e|.$$

This Hamiltonian describes the time evolution of the system accurately if $\Omega_{mw} \ll A_{\parallel}$. When the electron spin is in $|0_e\rangle$, the nuclear spin undergoes a free precession with an angular velocity $-A_{\parallel}$. When the electron spin is in $|1_e\rangle$, the nuclear spin rotates around an axis $e_{\theta_{mw}} = \cos(\theta_{mw}) e_x + \sin(\theta_{mw}) e_y$, where $(e_x, e_y)$ are the x and y unit vectors, with angular velocity $2\Omega_{mw}$.

The electron spin is periodically flipped via a dynamical decoupling sequence of the form $(\tau-\pi-2\tau+\pi-\tau)^{N/2}$, where N is an (even) number of pulses applied to the system. The total duration of the pulse sequence is $T_N = 2N\tau$. The gate applied to the nuclear spin is completed at $t = T_N$. The phase $\theta_{mw}$ of the microwave drive should be adjusted after each pulse k as:

$$\theta_{mw} = (k-1)\phi_k + \phi_c + \phi_0 \text{ for } k \text{ odd},$$

$$\theta_{mw} = (k-1)\phi_k + \phi_0 \text{ for } k \text{ even},$$

where $\phi_k = (2-\delta_{1k})\tau A_{\parallel}$, and $\phi_c = 0$ for unconditional rotations of the nuclear spin ($\phi_c = \pi$ for conditional rotations of the nuclear spin). The angle of rotation $\varphi$ of the nuclear spin about the axis determined by $\cos(\phi_0) e_x + \sin(\phi_0) e_y$ is $\varphi = 2\Omega_{mw}\tau N$. The Rabi frequency $\Omega_{mw}$ should therefore be appropriately adjusted in order to achieve the desired rotation angle $\varphi$. The unconditional gate implemented by the above described protocol is denoted as $R_{\phi_0,\varphi}^n$ and the conditional gate as $C_{\phi_0,\varphi}^n$. The conditional gate rotates the nuclear spin by an angle $-\varphi$ if the electron spin is initially in $|1_e\rangle$.

The following sequence of controlled and uncontrolled rotations produces a SWAP gate exchanging the states of the electron and the nuclear spin:

$$|\psi_f\rangle = CX^n \cdot H^e \cdot H^n \cdot CX^n \cdot H^e \cdot H^n \cdot CX^n |\psi_i\rangle,$$

where $CX^n$ is the controlled not gate conditionally flipping the nuclear spin, $H^s$ is the single-qubit Hadamard gate acting on the electron qubit, s=e, or the nuclear qubit, s=n. The single- and two-qubit gates disclosed above can be constructed from the conditional rotation of the nuclear spin and local qubit operations. In particular, the Hadamard gate acting on the nuclear spin can be constructed as $$H^n = R_{0,\pi}^n \cdot R_{\frac{\pi}{2},\frac{\pi}{2}}^n.$$

Similarly, $$CX^n = S_{\frac{\pi}{2}} \cdot R_{0,\frac{\pi}{2}}^n \cdot C_{0,\frac{\pi}{2}}^n,$$

with $$S_{\frac{\pi}{2}} = \sigma_e \sigma_e^{\dagger} + i\sigma_e^{\dagger}\sigma_e$$

(a rotation around the z axis).

The time-duration of the single-qubit rotations applied to the electron spin depends on the intensity of the applied pulses and can be treated as practically instantaneous. On the other hand, the gates applied to the nuclear spin rely on a free time evolution of the system limited by $\omega_{mw} \gg A_{\parallel}$. This sets the limit to the achievable state-transfer fidelity $\mathcal{F}_e$ when spin dephasing is considered. We phenomenologically account for pure dephasing of both the electron and the nuclear spin via the Lindblad superoperators $\mathcal{L}_{\sigma_e^{\dagger}\sigma_e}(\rho)$ and $\mathcal{L}_{\sigma_n^{\dagger}\sigma_n}(\rho)$ that together with $H_{en}$ describe the dynamics of the system. The fidelity of the state transfer performed by the SWAP gate is for a moderate value of the longitudinal spin-spin coupling $A_{\parallel}/(2\pi) = 500$ and a drive frequency set to $\Omega_{mw}/(2\pi) \approx 3.9$ kHz. We further consider $\gamma_e/(2\pi) = 10$ kHz and $\gamma_n/(2\pi) = 1$ kHz. With these values, the fidelity is $\mathcal{F}_e \approx 0.9975$.

Two-Qubit Gates Applicable to the Electron Spins

One advantage of the inventive hybrid quantum systems is that the color-center (AA) electron spins can be used to prepare non-classical many-body quantum-mechanical states for quantum information processing, quantum teleportation, or speedup of quantum-state transduction. Here, we disclose a gate that could be used to generate a GHZ state (i.e., an entangled Bell state) of a pair of electron-spin qubits coupled to a common vibrational mode. The electron-spin states can be coupled to a strain field via effective controllable coupling schemes as disclosed above. This leads to the effective interaction between a mode of an acoustical cavity coupled to two electron spins:

$$H_{eff} = \hbar\omega_{e1}\sigma_{e1}^\dagger\sigma_{e1} + \hbar\omega_{e2}\sigma_{e2}^\dagger\sigma_{e2} + \hbar\omega_p b^\dagger b + \hbar g_{eff}(\sigma_{e1} + \sigma_{e1}^\dagger)(b+b^\dagger) + \hbar g_{eff}(\sigma_{e2}+\sigma_{e2}^\dagger)(b+b^\dagger).$$

Here $\sigma_{e1} = |0_1\rangle\langle 1_1|$ ($\sigma_{e2}=|0_2\rangle\langle 1_2|$) are the lowering operators of the respective two-level spin systems, $b$ ($b^\dagger$) is the annihilation (creation) operator of the shared phonon mode, $\omega_{e1}$ and $\omega_{e2}$ are the frequencies of the respective spins, and $\omega_p$ is the frequency of the phonon mode. The effective coupling $g_{eff}$ can be realized as described above. It can be more convenient to transform the Hamiltonian above into the interaction picture:

$$H_{eff}^I = g_{eff}(\sigma_{e1}e^{-i\omega_{e1}t} + \sigma_{e1}^\dagger e^{i\omega_{e1}t})(be^{-i\omega_p t}+b^\dagger e^{i\omega_p t}) + g_{eff}(\sigma_{e2}e^{-i\omega_{e2}t}+\sigma_{e2}^\dagger e^{i\omega_{e2}t})(be^{-i\omega_p t}+b^\dagger e^{i\omega_p t}).$$

Next, we assume that the coupling $g_{eff}$ can be modulated in time as $g_{eff}(t) = (g_{eff}^0/4)(e^{i\omega_1 t}+e^{i\omega_2 t}+\text{H.c.})$ (H.c. stands for the Hermitian conjugate). We assume a situation where $\omega_p > \omega_e = \omega_{e1} = \omega_{e2}$ and therefore select the two drive frequencies as $\omega_1 = \omega_2 + \omega_p - \delta_{MS}$, and $\omega_2 = \omega_p - \omega_e - \delta_{MS}$, where $\delta_{MS}$ is a small detuning. We further simplify the Hamiltonian by assuming $\omega_{e1} = \omega_{e2} = \omega_e$. The interaction-picture Hamiltonian then becomes (considering only slowly oscillating terms in the RWA):

$$H_{eff}^{RWA} \approx g_{eff}^0[(\sigma_{e1}+\sigma_{e2})b^\dagger e^{-i(\omega_e-\omega_p+\omega_2)t} + (\sigma_{e1}^\dagger+\sigma_{e2}^\dagger)b^\dagger e^{i(\omega_e+\omega_p-\omega_1)t}+\text{H.c.}].$$

From this Hamiltonian we can obtain the effective coupling $g_{M-S}$ between the state $|0_1\rangle \otimes |0_2\rangle \otimes |0\rangle \equiv |gg, 0\rangle$ and the doubly excited state $|1_1\rangle \otimes |1_2\rangle \otimes |0\rangle \equiv |ee, 0\rangle$ (more generally $|gg, n\rangle$ and $|ee, n\rangle$, with n the number of phonons):

$$g_{M-S} \approx \frac{(g_{eff}^0)^2}{8\delta_{MS}}.$$

Figures 7A, 7B, 7C:
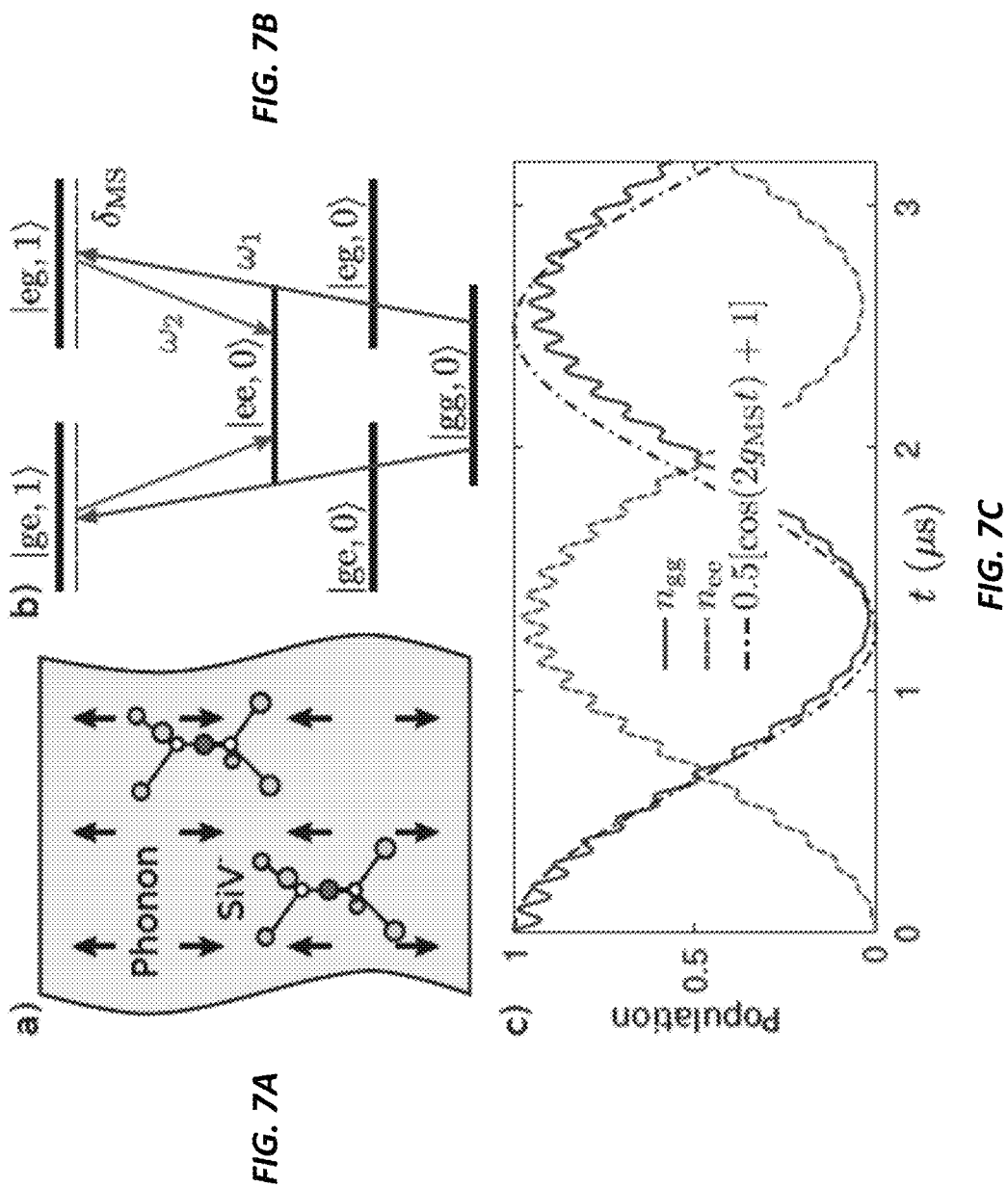
FIG. 7A illustrates a Mølmer-Sørensen gate with two electron spins of diamond color centers interacting with a shared mechanical mode of the phononic cavity, entangling the electron spins.
FIG. 7B shows a two-photon drive used to perform a transition from the ground state of the system shown in FIG. 7A to the doubly excited state without changing the number of phonons in the system or populating an intermediate state.
FIG. 7C is a plot of the dynamics of the ground-state population, $n_{gg}$ (solid line), and the doubly excited state population, $n_{ee}$ (dashed line), compared with the ideal time dependence (dash-dotted line) following from the effective model implementing the Mølmer-Sørensen gate.

FIG. 7 shows the resulting dynamics of the populations of the two excited states. The population of the state $|gg, 0\rangle$ (solid line) coherently transfers into the population of $|ee, 0\rangle$ (dashed line). For comparison, FIG. 7 shows the expression $0.5 [\cos(2g_{MS}t)+1]$ as the dot-dashed line. Both electron spins and the phonon are subject to decoherence as described above. If the time evolution stops at t≈0.675, the result is a highly entangled Bell state, the two-qubit GHZ state (up to a phase factor).

Deterministic State Teleportation

The use of an optically-active spin enables the teleportation of states between two superconducting qubits without transduction of their states to the optical domain as follows. First, nuclear-spin entanglement-at-a-distance is established by producing entanglement between two electron-photon pairs separated at a distance, routing the photons to a beam splitter, and performing a Bell-state measurement (BSM) in the optical domain that destroys the which-path information on the measured photons. Upon feedback of the BSM result to the initial nodes and application of appropriate conditional gates, entanglement is produced between the two electron spins and finally transferred to the nuclear spin as described above. The success of this probabilistic entanglement protocol is heralded by the detection of a photon in the BSM apparatus, resulting in a fidelity that is immune to photon loss in the routing network and, with sufficient generation rate, on-demand entanglement within a given time.

Once nuclear-spin entanglement is produced, the electron spins are optically reset, and the SC qubit of interest is transferred to its local electron spin using the phononic bus as described above. Finally, quantum teleportation is performed using the prepared entangled nuclear spins as a resource. A BSM is performed between the local nuclear spin and the electron spin containing the quantum state of the target SC qubit. Upon feed-forward of the BSM results to the distant target node and subsequent single-qubit operations, the SC state is teleported to the distant nuclear spin. The state can be transferred to distant SC qubit via the phononic bus as desired or maintained in the nuclear-spin quantum memory. In this way the quantum emitter enables SC quantum state transfer without direct transduction of the relevant quantum information into lossy, long-distance links.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A hybrid quantum system comprising:
   a superconducting qubit to emit a microwave photon representing a quantum state of the superconducting qubit;
   a piezoelectric transducer, coupled to the superconducting qubit, to transduce the microwave photon into a phonon;
   a mechanical resonator, coupled to the piezoelectric transducer, to absorb the phonon; and
   a solid-state artificial atom qubit, having an electron spin coupled to a strain induced in the mechanical resonator through absorption of the phonon, to receive the quantum state.

2. The hybrid quantum system of claim 1, wherein the superconducting qubit comprises a Josephson junction.

3. The hybrid quantum system of claim 1, wherein the mechanical resonator comprises a diamond optomechanical cavity.

4. The hybrid quantum system of claim 1, wherein the mechanical resonator comprises a silicon phononic cavity and the solid-state artificial atom is disposed in a diamond layer formed on the silicon phononic cavity.

5. The hybrid quantum system of claim 1, further comprising:
   a tunable coupler, coupling the superconducting qubit to the piezoelectric transducer, to control a coupling strength between the superconducting qubit and the piezoelectric transducer.

6. The hybrid quantum system of claim 1, further comprising:
   a phononic waveguide, coupled to the piezoelectric transducer and the mechanical resonator, to guide the phonon between the piezoelectric transducer and the mechanical resonator.

7. The hybrid quantum system of claim 1, further comprising at least one of:
   a laser, a microwave source, or a magnetic field source, in electromagnetic communication with the solid-state artificial atom qubit, to mediate coupling between the electron spin and the strain.

8. The hybrid quantum system of claim 1, further comprising at least one of:
   a laser or a microwave source, in electromagnetic communication with the solid-state artificial atom qubit, to mediate coupling of the electron spin to at least one of a nuclear spin or a photon.

9. A method of transferring a quantum state from a superconducting qubit to a solid-state artificial atom qubit, the method comprising:
   emitting a microwave photon from the superconducting qubit, the microwave photon representing a quantum state of the superconducting qubit;
   transducing the microwave photon into a phonon;
   absorbing the phonon in a mechanical resonator; and
   coupling strain in the mechanical resonator to an electron spin of the solid-state artificial atom qubit so as to cause the electron spin to encode the quantum state.

10. The method of claim 9, wherein emitting the microwave photon from the superconducting qubit comprises smoothly varying a coupling strength between the superconducting qubit and a piezoelectric transducer.

11. The method of claim 9, wherein coupling the strain in the mechanical resonator to the electron spin comprises smoothly varying a coupling strength between the strain and the electron spin.

12. The method of claim 9, further comprising:
coupling the phonon into a waveguide; and
guiding the phonon to the mechanical resonator via the waveguide.

13. The method of claim 9, further comprising:
coupling the electron spin of the solid-state artificial atom to a nuclear spin of an atom.

14. The method of claim 9, further comprising:
coupling the electron spin of the solid-state artificial atom to a photon; and
coupling the photon to another qubit.

15. A hybrid quantum system comprising:
a superconducting quantum processing unit;
an artificial-atom-based quantum memory; and
a phononic bus, coupled to the superconducting quantum processing unit and to the artificial-atom-based quantum memory, to transfer a quantum state between the superconducting quantum processing unit and the artificial-atom-based quantum memory.

16. The hybrid quantum system of claim 15, wherein the artificial-atom-based quantum memory encodes the quantum state in an electron spin of an artificial atom.

17. The hybrid quantum system of claim 15, further comprising:
a piezoelectric transducer, operably coupled to the superconducting quantum processing unit and the phononic bus, to transduce a microwave photon representing the quantum state into a phonon and to couple the phonon to a mechanical mode of the phononic bus.

18. The hybrid quantum system of claim 17, wherein the phononic bus defines a cavity to transduce the phonon into strain that is coupled to the artificial-atom-based quantum memory via strain-spin coupling.

19. The hybrid quantum system of claim 18, further comprising:
at least one of a laser, a microwave source, or an electromagnet, in electromagnetic communication with the artificial-atom-based quantum memory, to mediate a strength of the strain-spin coupling.

20. The hybrid quantum system of claim 15, further comprising:
at least one of a laser or a microwave source, in electromagnetic communication with the artificial-atom-based quantum memory, to couple the artificial-atom-based quantum memory to a quantum network.

* * * * *